(12) United States Patent
Oku et al.

(10) Patent No.: US 7,385,276 B2
(45) Date of Patent: Jun. 10, 2008

(54) SEMICONDUCTOR DEVICE, AND METHOD FOR MANUFACTURING THE SAME

(75) Inventors: Yoshiaki Oku, Kyoto (JP); Norikazu Nishiyama, Toyonaka (JP); Korekazu Ueyama, Takarazuka (JP)

(73) Assignee: Rohm Co., Ltd., Kyoto (JP)

( * ) Notice: Subject to any disclaimer, the term of this patent is extended or adjusted under 35 U.S.C. 154(b) by 145 days.

(21) Appl. No.: 11/399,724

(22) Filed: Apr. 7, 2006

(65) Prior Publication Data
US 2006/0186559 A1 Aug. 24, 2006

Related U.S. Application Data

(62) Division of application No. 10/482,564, filed as application No. PCT/JP02/06508 on Jun. 27, 2002, now Pat. No. 7,075,170.

(30) Foreign Application Priority Data

| Jun. 29, 2001 | (JP) | ............................. 2001-198943 |
| Jun. 29, 2001 | (JP) | ............................. 2001-198944 |
| Jun. 29, 2001 | (JP) | ............................. 2001-198964 |
| Jun. 29, 2001 | (JP) | ............................. 2001-198965 |
| Jun. 29, 2001 | (JP) | ............................. 2001-198990 |

(51) Int. Cl.
*H01L 23/58* (2006.01)

(52) U.S. Cl. .............. 257/632; 257/637; 257/E21.273; 257/E21.581

(58) Field of Classification Search ............ 257/632, 257/634, 635–637, E21.273, E21.581; 977/700
See application file for complete search history.

(56) References Cited

U.S. PATENT DOCUMENTS

| 5,103,288 A | 4/1992 | Sakamoto et al. |
| 6,399,177 B1 | 6/2002 | Fonash et al. |
| 2003/0129370 A1 | 7/2003 | Kondoh et al. |

FOREIGN PATENT DOCUMENTS

| EP | 1 094 506 A2 | 4/2001 |
| EP | 1 124 252 A2 | 8/2001 |
| JP | 63015203 A * | 1/1988 |
| JP | 04199153 A * | 7/1992 |
| JP | 2001-118841 | 4/2001 |
| JP | 2002-217190 | 8/2002 |
| WO | 01/75957 A1 | 10/2001 |

OTHER PUBLICATIONS

Yunfeng Lu et al. "Continuous formation of supported cubic and hexagonal mesoporous films by sol-gel dep-coating" Nature, 1997, vol. 389, pp. 364-368.
Alan Sellinger et al. "Continuous self-assembly of organic-inorganic nanocomposite coatings that mimic nacre" Nature, 1998, vol. 394, pp. 256-260.

* cited by examiner

*Primary Examiner*—Brook Kebede
(74) *Attorney, Agent, or Firm*—Hamre, Schumann, Mueller & Larson, P.C.

(57) ABSTRACT

The invention is characterized by attaining a lower dielectric constant and including an inorganic dielectric film which is formed on the surface of a substrate and has a cyclic porous structure having a pore ratio of 50% or higher.

15 Claims, 22 Drawing Sheets

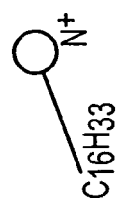
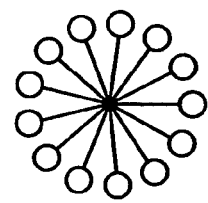
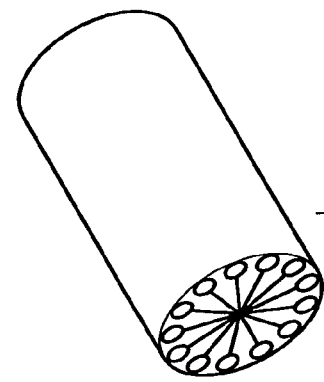
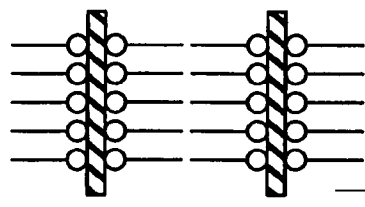
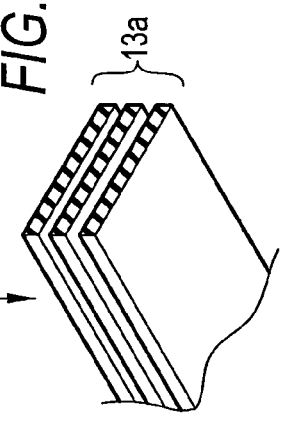
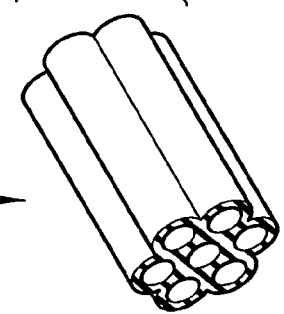
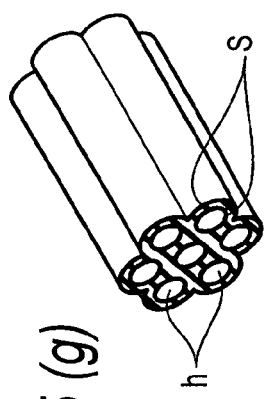
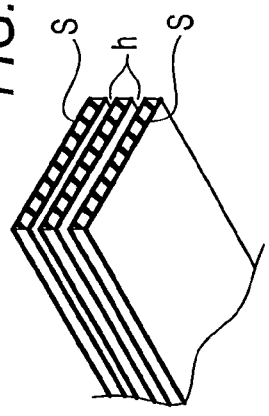

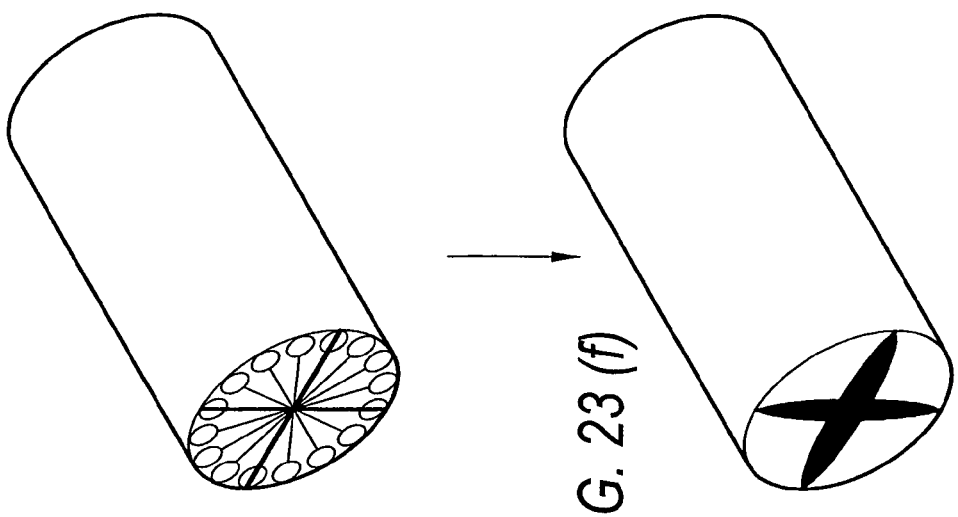
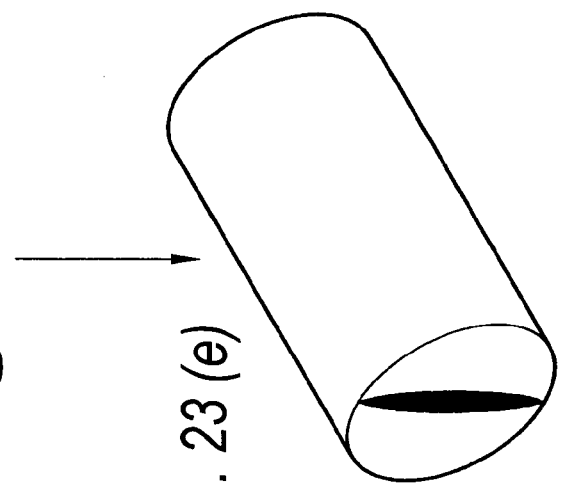
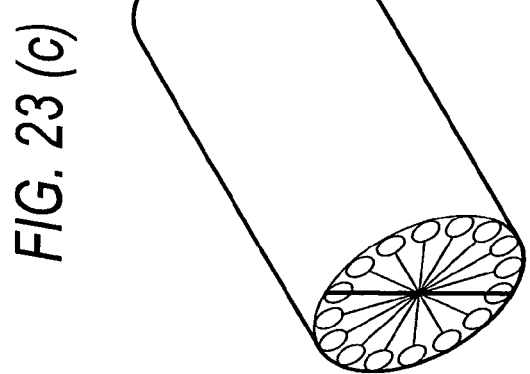
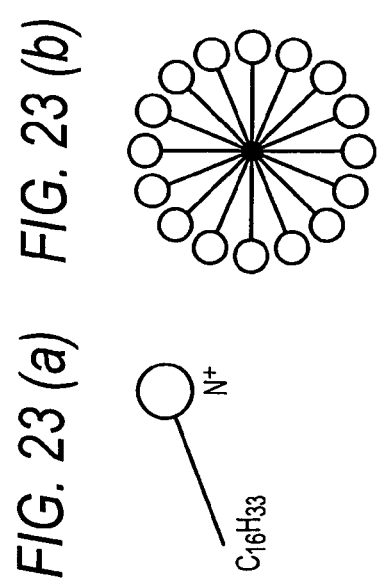
FIG. 23 (a) FIG. 23 (b) FIG. 23 (c) FIG. 23 (d) FIG. 23 (e) FIG. 23 (f)

SEMICONDUCTOR DEVICE, AND METHOD FOR MANUFACTURING THE SAME

CROSS REFERENCE TO RELATED APPLICATIONS

This application is a Division of application Ser. No. 10/482,564, filed Dec. 29, 2003, which is a U.S. National Stage Application of PCT/JP02/06508, filed Jun. 27, 2002, which applications are incorporated herein by reference.

FIELD OF THE INVENTION

The invention relates to a semiconductor device and a method for manufacturing the same, and more particularly, to an inorganic dielectric film of low dielectric constant.

BACKGROUND

Lowering the dielectric constant of an interlayer dielectric film is an important challenge to be met for making a semiconductor device faster and reduce power consumption. Various ideas have been implemented with a view toward lowering a dielectric constant.

In order to lower a dielectric constant of the interlayer dielectric film of a related-art semiconductor device, the following methods have been put forward:

(1) a method for doping a silica film, which is an inorganic dielectric film, with fluorine;

(2) a method for forming an organic dielectric material having a low dielectric constant as a base material; and (3) a method for intentionally forming a porous film.

However, in the case of the method defined in (1), a silica film can be doped with fluorine on the order, at most, of a few percentages in element proportion, because the heat resistance of the dielectric film is deteriorated. Therefore, there arises a problem of the dielectric constant being lowered by only 10% to 15% from the dielectric constant of the related-art silica-based interlayer dielectric film.

In the case of the method defined in (2), the moisture resistance of the base material is considerably deteriorated as compared with that of the related-art silica-based interlayer dielectric film, because the base material is an organic material, thereby leading to occurrence of a problem of a decrease in reliability of a semiconductor element.

In the case of the method defined in (3), since a porous structure is random, the mechanical strength of the interlayer dielectric film will be deteriorated remarkably. Hence, the semiconductor element is vulnerable to fracture when being packaged, which is responsible for the decrease in the reliability of the semiconductor element.

In many cases, a porous structure is not closed. If the porous structure is not closed, the moisture resistance of the interlayer dielectric film will be decreased remarkably, which in turn induces a decrease in the reliability of the semiconductor element.

Moreover, as further miniaturization of the semiconductor device and realization of a still higher packing density are pursued, inter-wiring capacitance and inter-wiring-layer-capacitance pose serious problems.

As mentioned above, the related-art dielectric film suffers from a problem of the inability to sufficiently reduce a dielectric constant and a problem of insufficient mechanical strength.

SUMMARY OF THE INVENTION

The invention has been conceived in light of the foregoing circumstances and aims at providing a dielectric film having a low dielectric constant and high mechanical strength.

The invention also aims at providing a semiconductor device capable of diminishing capacitance existing between wiring layers and inter-line capacitance even while attaining miniaturization and tighter packing of a semiconductor device.

Accordingly, the invention is characterized in that a semiconductor device comprises an inorganic dielectric film which is formed on the surface of a substrate and has a pore ratio of 50% or higher.

Since the dielectric constant of air is low, by means of such a configuration the dielectric constant of the dielectric can be reduced further as compared with that achieved when the dielectric film is doped with fluorine. Hence, the dielectric constant of the dielectric film can be minimized.

Preferably, the invention is characterized in that the inorganic dielectric film is formed on the surface of the substrate, and the pores have an orientation characteristic.

According to the configuration, the pores possess the orientation characteristic. Hence, mechanical strength of the dielectric film can be enhanced, and a dielectric film of high reliability can be obtained.

Preferably, the invention is characterized by further comprising an inorganic dielectric film which is formed on the surface of the substrate and has periodic porous structures of two or more types.

Since the dielectric constant of air is low, by means of such a configuration the dielectric constant of the dielectric film can be reduced further. The dielectric constant of the dielectric film can be minimized. Since the dielectric film has a plurality of types of cyclic porous structures, opening sections of the pores can be closed by means of the domains. As a result, the mechanical strength of the dielectric film can be enhanced, and a dielectric film of high reliability can be obtained.

More preferably, the invention is characterized in that the inorganic film has repeated arrangement of a first porous structure domain having periodically-arranged columnar pores and a second porous structure domain having layered pores cyclically arranged in a direction perpendicular to the surface of the substrate.

According to such a configuration, the first porous structure domain having periodically-arranged columnar pores and the second porous structure domain having layered pores periodically arranged in a direction perpendicular to the surface of the substrate are repeatedly arranged. Particularly when the dielectric film is used as an interlayer dielectric film, the pores can assume a closed structure in which no opening sections are provided for upper layer wiring or lower layer wiring. Hence, the dielectric film plays the role of a low dielectric thin film having superior moisture resistance and enhanced reliability. Further, a uniform electrical characteristic can be achieved.

Moreover, the porous structure is oriented in a different direction in each domain. Hence, the opening sections of the pores can be closed by each other. There can be obtained a low dielectric thin film having superior moisture resistance substantially equal to that of a dense film, superior mechanical strength derived from a cyclic structure, and an ultimately low dielectric constant. An interlayer space is supported by adjacent layers, and hence a layered cyclic porous geometry, which is usually considered to be unstable, can be constituted stably with superior mechanical strength.

Preferably, the invention is characterized in that the inorganic dielectric film is formed by repeatedly laminating, on and in parallel with the surface of the substrate, a first porous structure domain layer in which columnar pores are arranged cyclically, and a second porous structure domain in which layered pores are cyclically arranged in parallel with the surface of the substrate.

In addition to yielding the previously-described effects, the configuration enables the pores to assume a closed structure having no opening sections for upper layer and lower layer wiring, particularly when the dielectric film is used as an interlayer dielectric film. Hence, the dielectric film plays the role of a low dielectric thin film having superior moisture resistance and higher reliability.

Preferably, the invention is further characterized in that the inorganic dielectric film comprises a semiconductor substrate, or a first layer wiring conductor formed on the surface of the semiconductor substrate, and an interlayer dielectric film interposed between the semiconductor substrate or the first layer wiring conductor, and a second layer wiring conductor formed thereon.

Such a configuration enables formation of a dielectric film of low capacitance. Hence, parasitic capacitance can be reduced, and the semiconductor device can be made faster.

Preferably, the invention is characterized by comprising a first interlayer dielectric film region which is formed on the first layer wiring conductor and has contact holes to contact the first layer wiring conductor, and a second interlayer dielectric film to be charged into an inter-wiring area of a second layer wiring conductor formed on the first interlayer dielectric film, wherein the first interlayer dielectric film is formed from a second porous structure domain in which layered pores are arranged cyclically.

According to this configuration, the second porous structure domain in which the layered pores are arranged cyclically is constituted in the area surrounding the contact hole. Hence, interlayer capacitance can be reduced.

More preferably, the invention is further characterized in that the interlayer dielectric film comprises a first interlayer dielectric film region which is formed on the first layer wiring conductor and has contact holes to contact the first layer wiring conductor, and a second interlayer dielectric film to be charged into an inter-wiring area of a second layer wiring conductor formed on the first interlayer dielectric film, wherein the first interlayer dielectric film is formed from a second porous structure domain in which layered pores are arranged cyclically, and the second interlayer dielectric film is formed from a first porous structure domain in which columnar pores are arranged cyclically.

According to this configuration, the second porous structure domain in which the layered pores are arranged cyclically is constituted in the area surrounding the contact hole. Hence, interlayer capacitance can be reduced. Columnar pores are arranged laterally in an upper layer wiring area constituting an inter-wiring dielectric film. For this reason, lateral capacitance is diminished to a great extent. Preferably, use of a first porous structure domain arranged such that the direction in which the columnar pores are arranged becomes parallel with a wiring direction enables provision of a highly reliable semiconductor device without involvement of occurrence of a problem of short circuit between wiring lines.

Preferably, the invention is further characterized in that the interlayer dielectric film comprises a first interlayer dielectric film which is formed on the first layer wiring conductor and has contact holes to contact the first layer wiring conductor, and a second interlayer dielectric film to be charged into an inter-wiring area of a second layer wiring conductor formed on the first interlayer dielectric film, wherein the first interlayer dielectric film is formed from a second porous structure domain in which layered pores formed so as to become parallel with the surface of the substrate are arranged cyclically, and the second interlayer dielectric film is formed from a third porous structure domain in which layered pores formed so as to become substantially perpendicular to the surface of the substrate are arranged cyclically.

According to this configuration, the second porous structure domain in which the layered pores are arranged cyclically so as to become parallel with the surface of the substrate is constituted in the area surrounding the contact hole. Hence, interlayer capacitance can be reduced. In the upper layer wiring area constituting the interlayer dielectric film, layered pores are arranged cyclically so as to become substantially perpendicular to the surface of the substrate. Hence, lateral capacitance is diminished further, and there can be provided a highly reliable semiconductor device which does not involve occurrence of a problem of a short circuit between wiring lines.

A method for manufacturing a semiconductor device according to the invention is characterized in that processes for forming an interlayer dielectric film comprise a process of producing a first precursor solution containing a silica derivative and a surface active agent so as to assume a first composition ratio at which pores are arranged cyclically; a process of producing a second precursor solution containing a silica derivative and a surface active agent so as to assume a second composition ratio at which pores are arranged cyclically; a preliminary crosslinking process which raises the temperature of the first precursor solution and that of the second precursor solution, to thus initiate a crosslinking reaction; a contact process for bringing into contact with the surface of the substrate the first and second precursor solutions that have started the crosslinking reaction in the preliminary crosslinking process; and a process for sintering the substrate with which the first and second precursor solutions have been brought into contact, so as to decompose and remove the surface active agent, whereby a dielectric film is formed.

By means of such a configuration, there can be provided a dielectric film which has extremely superior controllability, superior mechanical strength, and a minimum dielectric constant. Further, there can be readily formed an interlayer dielectric film having cyclic structures of two types or more, such as an interlayer dielectric film formed from a first porous structure domain layer in which columnar pores are arranged cyclically and a second porous structure domain layer in which layered pores are cyclically arranged in parallel with the surface of the substrate, both being repeatedly stacked on and in parallel with the surface of the substrate.

Since the dielectric film can be formed at low temperature, a highly reliable dielectric film can be formed without affecting the substrate, even when the dielectric film is used as an interlayer dielectric film of an integrated circuit. Since the dielectric film can be formed without involvement of a heating process of 500° C. or more, the invention can also be applied to a case where aluminum wiring is employed.

Since the dielectric film can be formed by means of contact of liquid, a pattern can be formed with high accuracy within a minute area, thereby improving reliability.

A pore ratio can be changed appropriately by adjusting the concentration of a precursor solution. A dielectric thin film of desired dielectric constant can be formed with extremely superior operability.

The method of the invention is further characterized in that a preliminary crosslinking reaction is initiated after the first and second precursor solutions having been brought into contact with the surface of the substrate.

The method enables easy, efficient formation of an inorganic dielectric film in which pores having two or more types of periodicity are formed.

Preferably, the invention is characterized in that the contact process is a process for sequentially and repeatedly immersing the substrate into the first and second precursor solutions.

The configuration enables formation, with superior productivity, of a low dielectric thin film in which different porous structure domains are stacked.

Preferably, the invention is characterized in that the contact process includes a process for immersing the substrate into the first precursor solution and raising the substrate at a desired speed, and a process for immersing the substrate into the second precursor solution and raising the substrate at a desired speed.

Preferably, the invention is characterized in that the contact process is a process for sequentially and repeatedly applying the first and second precursor solutions over the substrate.

More preferably, the invention is characterized in that the contact process is a spin coating process for dropping the first and second precursor solutions on the substrate and spinning the substrate.

Such a configuration enables easy adjustment of a film thickness or a pore ratio. A low dielectric thin film can be formed with superior productivity.

Preferably, the invention is characterized in that the inorganic dielectric film is formed on the surface of the substrate and has a cyclic porous structure including columnar pores oriented so as to become parallel with the surface of the substrate and having a pore ratio of 50% or higher.

According to such a configuration, the pores are oriented in parallel with the surface of the substrate. Hence, a low, uniform dielectric constant is achieved in the direction perpendicular to the surface of the substrate. Particularly when the dielectric film is used as an interlayer dielectric film, the pores can assume a closed structure in which no opening sections are provided for upper layer wiring or lower layer wiring. Hence, the dielectric film plays the role of an effective low dielectric thin film having superior moisture resistance and enhanced reliability.

Preferably, the invention is characterized in that the inorganic dielectric film is formed on the surface of the substrate and includes a plurality of cyclic porous structure domains containing columnar pores oriented in one direction so as to become parallel with the surface of the substrate; and adjacent porous structure domains are oriented in different directions.

Moreover, the porous structure is oriented in a different direction in each domain. Hence, the opening sections of the pores can be closed by each other. There can be obtained a low dielectric thin film having superior moisture resistance substantially equal to that of a dense film, superior mechanical strength derived from a cyclic structure, and an ultimately low dielectric constant. An interlayer space is supported by adjacent layers, and hence a layered cyclic porous geometry, which is usually considered to be unstable, can be constituted stably with superior mechanical strength.

Preferably, the invention is characterized in that the inorganic dielectric film is formed on the surface of the substrate and has a cyclic porous structure domain in which layered pores are oriented cyclically in one direction so as to become parallel with the surface of the substrate.

According to such a configuration, the layered pores are oriented in parallel with the surface of the substrate. Hence, a low, uniform dielectric constant is achieved in the direction perpendicular to the surface of the substrate. Particularly when the dielectric film is used as an interlayer dielectric film, the pores can assume a closed structure in which no opening sections are provided for upper layer wiring or lower layer wiring. Hence, the dielectric film plays the role of an effective low dielectric thin film having superior moisture resistance and enhanced reliability. Such a structure enables an attempt to realize a dielectric film which is higher in pore ratio and lower in dielectric constant than a dielectric film having columnar pores.

A method for manufacturing a semiconductor device according to the invention is characterized by comprising: a process of producing a precursor solution containing a silica derivative and a surface active agent; a preliminary crosslinking process for commencing a crosslinking reaction by increasing the temperature of the precursor solution; a contact process for bringing, into contact with the surface of the substrate, the precursor solution that has commenced the crosslinking reaction in the preliminary crosslinking process; and a process for sintering the substrate with which the precursor solution has been brought into contact to decompose and remove the surface active agent.

According to such a configuration, there can be provided a dielectric film which has extremely superior controllability, superior mechanical strength, and a minimum dielectric constant. Since the dielectric film can be formed at low temperature, a highly-reliable dielectric film can be formed without affecting the substrate even when the dielectric film is used as an interlayer dielectric film of an integrated circuit.

The pore rate can be adjusted as required by adjusting the concentration of the precursor solution. A dielectric thin film of desired dielectric constant can be formed with extremely superior operability.

Preferably, the invention is characterized in that the contact process is a process for immersing the substrate into the precursor solution.

The configuration enables formation of a low dielectric thin film with superior productivity.

Preferably, the invention is characterized in that the contact process includes a process for immersing the substrate into the precursor solution and raising the substrate at a desired speed.

The configuration enables formation of a low dielectric thin film with superior productivity.

Preferably, the invention is characterized in that the contact process is a process for applying the precursor solution over the substrate.

The configuration enables formation of a low dielectric thin film with superior productivity.

Preferably, the invention is characterized in that the contact process is a spin coating process for dropping the precursor solution on the substrate and spinning the substrate.

The configuration enables easy adjustment of a film thickness or a pore ratio and formation of a low dielectric thin film with superior productivity.

The invention is characterized by further comprising an inorganic dielectric film which is formed on the surface of the substrate and has a porous structure whose framework surrounds pores and is coated with a hydrophobic layer.

By means of such a configuration, exterior and interior surfaces of a framework surrounding pores of the porous structure are reformed with a hydrophobic layer on a molecular level, thereby enhancing moisture resistance while the mechanical strength of the film is maintained. Since the dielectric constant of air is low, by means of the porous structure the dielectric constant of the dielectric film can be reduced further as compared with the case where the dielectric film is doped with fluorine. Hence, the dielectric constant of the dielectric film can be minimized.

Preferably, the invention is characterized in that the inorganic dielectric film is formed on the surface of the substrate, and the pores have an orientation characteristic.

According to the configuration, the pores possess the orientation characteristic and a cyclic porous structure. Hence, mechanical strength of the dielectric film can be enhanced, and a dielectric film having high reliability can be obtained.

Preferably, the invention is characterized in that the inorganic dielectric film is formed on the surface of the substrate and has a cyclic porous structure in which columnar pores are oriented so as to become parallel with the surface of the substrate.

According to such a configuration, the pores are oriented in parallel with the surface of the substrate. Hence, a low, uniform dielectric constant is achieved in the direction perpendicular to the surface of the substrate. Particularly when the dielectric film is used as an interlayer dielectric film, the pores can assume a closed structure in which no opening sections are provided for upper layer wiring or lower layer wiring. Hence, the dielectric film plays the role of an effective low dielectric thin film having superior moisture resistance and enhanced reliability.

Preferably, the invention is characterized in that the inorganic dielectric film is formed on the surface of the substrate and includes a plurality of cyclic porous structure domains containing columnar pores oriented in one direction so as to become parallel with the surface of the substrate; and adjacent porous structure domains are oriented in different directions.

According to the configuration, the porous structure is oriented in a different direction in each domain. Hence, the opening sections of the pores can be closed by each other. There can be obtained a low dielectric thin film having superior moisture resistance substantially equal to that of a dense film, superior mechanical strength derived from a cyclic structure, and an ultimately low dielectric constant. An interlayer space is supported by adjacent layers, and hence a layered cyclic porous geometry, which is usually considered to be unstable, can be constituted stably with superior mechanical strength.

Preferably, the invention is characterized in that the inorganic dielectric film has a cyclic porous structure including layered pores.

In addition to yielding the foregoing effects, the configuration enables an attempt to increase the pore ratio and to lower the dielectric constant further.

Preferably, the invention is characterized in that the inorganic dielectric film has a cyclic porous structure including layered pores oriented so as to become parallel with the surface of the substrate.

Preferably, the invention is characterized in that the inorganic dielectric film has a cyclic porous structure domain including layered pores possessing two or more types of spatial orientation characteristics.

According to such a configuration, there can be provided an inorganic dielectric film having uniform, high mechanical strength and a low dielectric constant. In addition to yielding the foregoing effects, the configuration enables the pores to assume a closed structure in which no opening sections are provided for upper layer wiring or lower layer wiring particularly when the dielectric film is used as an interlayer dielectric film. Hence, the dielectric film plays the role of an effective low dielectric thin film having superior moisture resistance and enhanced reliability.

More preferably, the invention is characterized in that the inorganic dielectric film is formed by means alternately stacking a cyclic porous structure including layered pores and a cyclic porous structure including columnar pores so as to become parallel with the surface of the substrate.

Preferably, the invention is characterized in that the inorganic dielectric film is formed by alternately stacking a first layer having a cyclic porous structure domain including layered pores of two or more types of orientation characteristics, and a second layer having a cyclic porous structure domain including columnar pores having two or more types of orientation characteristics, so as to become parallel with the surface of the substrate.

Preferably, the invention is characterized in that the inorganic dielectric film has a porous structure having pores constituting a three-dimensional network.

According to the structure, the pores constitute the three-dimensional network. Hence, the paths of the pores become longer, and closing of the opening sections of the pores by each other in a linear direction becomes easy. There can be obtained a low dielectric thin film having superior moisture resistance substantially equal to that of a dense film, superior mechanical strength, and an ultimately low dielectric constant.

Preferably, the invention is characterized in that the inorganic dielectric film is a semiconductor substrate or a lower layer wiring conductor formed thereon, and an interlayer dielectric film is interposed between the semiconductor substrate or the lower layer wiring conductor, and an upper layer wiring conductor.

The configuration enables an attempt to diminish a dielectric constant of the interlayer dielectric film. Hence, a decrease in interlayer capacitance and provision of a semiconductor device which operates at high speed can be realized.

A second invention is characterized by providing a method for manufacturing a semiconductor device, comprising: a process of producing a precursor solution containing a silica derivative and a surface active agent; a contact process for bringing the precursor solution that has commenced the crosslinking reaction in the preliminary crosslinking process into contact with the surface of the substrate; a process for sintering the substrate with which the precursor solution has been brought into contact, to thereby decompose and remove the surface active agent; and a process for subjecting a silica thin film of porous structure obtained in the decomposition removal process to hydrophobic treatment, thereby forming a dielectric film of porous structure having a framework whose surface is coated with a hydrophobic layer.

The configuration enables provision of a dielectric film which has extremely high controllability, high moisture resistance, superior mechanical strength, and an extremely low dielectric constant. Since the dielectric film can be formed at low temperature, a highly reliable dielectric film can be formed without affecting the substrate, even when the dielectric film is used as an interlayer dielectric film of an integrated circuit. Finally, the moisture resistance can be enhanced by merely subjecting the dielectric film to hydrophobic treatment, and thus the reliability of the dielectric film can be improved very easily.

Preferably, the invention further comprises a preliminary crosslinking process, preceding the contact process, for raising the temperature of the precursor solution in order to initiate a crosslinking reaction.

Such a configuration enables a further improvement in productivity.

The pore rate can be adjusted as required by adjusting the concentration of the precursor solution. A dielectric thin film of desired dielectric constant can be formed with extremely superior operability.

Preferably, the invention is characterized in that the hydrophobic treatment process is a sililation process.

The configuration enables easy formation of a hydrophobic layer by merely exposing the dielectric film to a sililation solution, mist, or vapor.

Preferably, the invention is characterized in that the contact process is a process for immersing the substrate into the precursor solution.

The configuration enables formation of a low dielectric thin film with superior productivity.

Preferably, the invention is characterized in that the contact process is a process for immersing the substrate into the precursor solution and raising the substrate at a desired speed.

The configuration enables formation of a low dielectric thin film with superior productivity.

Preferably, the invention is characterized in that the contact process is a process for applying the precursor solution over the substrate.

The configuration enables formation of a low dielectric thin film with superior productivity.

Preferably, the invention is characterized in that the contact process is a spin coating process for dropping the precursor solution on the substrate and spinning the substrate.

The configuration enables easy adjustment of a film thickness or a pore ratio and formation of a low dielectric thin film with superior productivity.

The invention is characterized by further comprising an inorganic dielectric film which is formed on the surface of the substrate and has a porous structure having pores which constitute a three-dimensional network.

Since the dielectric constant of air is low, by means of such a configuration the low dielectric film can be reduced further as compared with the case where the dielectric film is doped with fluorine. Hence, the dielectric constant of the dielectric film can be minimized. The pores constitute a three-dimensional network, and hence the physical properties of the film can be rendered uniform. Further, the resultant electrical characteristic is isotropic. The paths of the pores become longer, and closing of the opening sections of the pores by each other in a linear direction becomes easy. There can be obtained a low dielectric thin film having superior moisture resistance substantially equal to that of a dense film, superior mechanical strength, and an ultimately low dielectric constant.

Preferably, the invention is characterized by further comprising a porous structure having pores constituting a three-dimensional cyclic network.

According to the configuration, the pores assume a porous structure having pores which constitute a cyclic three-dimensional network. Hence, the mechanical strength of the film can be enhanced, and a highly reliable dielectric film can be obtained.

Preferably, the invention is characterized in that the inorganic dielectric film is a semiconductor substrate or a lower layer wiring conductor formed thereon, and an interlayer dielectric film is interposed between the semiconductor substrate or the lower layer wiring conductor, and an upper layer wiring conductor.

The configuration enables an attempt to lowers a dielectric constant of the interlayer dielectric film. Hence, a decrease in interlayer capacitance and provision of a semiconductor device which operates at high speed can be realized.

The invention is characterized by providing a method for manufacturing a semiconductor device, comprising: a process of producing a precursor solution containing a silica derivative and a surface active agent; a contact process for bringing the precursor solution into contact with the surface of a substrate; and a process for sintering the substrate with which the precursor solution has been brought into contact, to thereby decompose and remove the surface active agent.

The configuration enables provision of a dielectric film which has extremely high controllability, superior mechanical strength, and an extremely low dielectric constant. Since the dielectric film can be formed at low temperature, a highly reliable dielectric film can be formed without affecting the substrate even when the dielectric film is used as an interlayer dielectric film of an integrated circuit.

Preferably, the invention further comprises a preliminary crosslinking process, preceding the contact process, for raising the temperature of the precursor solution in order to initiate a crosslinking reaction.

Such a configuration enables a further improvement in productivity.

The pore ratio can be adjusted as required by adjusting the concentration of the precursor solution. A dielectric thin film of desired dielectric constant can be formed with extremely superior operability.

Preferably, the invention is characterized in that the contact process is a process for immersing the substrate into the precursor solution.

The configuration enables formation of a low dielectric thin film with superior productivity.

Preferably, the invention is characterized in that the contact process is a process for immersing the substrate into the precursor solution and raising the substrate at a desired speed.

The configuration enables formation of a low dielectric thin film with superior productivity.

Preferably, the invention is characterized in that the contact process is a process for applying the precursor solution over the substrate.

The configuration enables formation of a low dielectric thin film with superior productivity.

Preferably, the invention is characterized in that the contact process is a spin coating process for dropping the precursor solution on the substrate and spinning the substrate.

The configuration enables easy adjustment of a film thickness or a pore ratio and formation of a low dielectric thin film with superior productivity.

The invention is also characterized by further comprising an inorganic dielectric film which is formed on the surface of the substrate and which has a porous structure containing at least one support member in the pore.

According to the configuration, a columnar structure of molecular size is contained in the pore section of the cyclic porous structure, whereby the resistance of the pore section to external force can be increased. Since the dielectric constant of air is low, by means of such a configuration the dielectric constant of the dielectric film can be lowered further as compared with the case where the dielectric film is doped with fluorine. Hence, the dielectric constant of the dielectric film can be minimized. Preferably, the pore ratio is set to a value of 50% or higher. Thus, the columnar members are inserted into pores, thereby constituting support members. As a result, the mechanical strength of the film is enhanced to a great extent, and a porous structure having an extremely high pore ratio can be obtained.

Preferably, the invention is characterized in that the inorganic dielectric film is formed on the surface of the substrate, and the pores possess the orientation characteristic.

In addition to yielding the foregoing effects, the configuration enables an increase in mechanical strength of the dielectric film, because the pores possess the orientation characteristic and the inorganic dielectric film has the cyclic porous structure. There can be formed a highly-reliable dielectric film.

Preferably, the invention is characterized in that the inorganic dielectric film is formed on the surface of the substrate and has columnar pores and a cyclic porous structure including support members arranged within the columnar pores so as to extend across the diameter of a bottom surface thereof.

According to the configuration, the support member serving as a support is inserted into the columnar pore so as to extend across the diameter of the bottom surface. Hence, the mechanical strength of the film can be increased to a great extent. Further, the pores are oriented, and hence the pore ratio can be improved, and there can be formed an effective low dielectric thin film having superior mechanical strength and high reliability.

Preferably, the invention is characterized in that the inorganic dielectric film is formed on the surface of the substrate and has columnar pores oriented so as to become parallel with the surface of the substrate, as well as a cyclic porous structure including support members arranged within the columnar pore so as to extend across the diameter of a bottom surface thereof.

According to the configuration, the support member serving as a support is inserted into the columnar pore so as to extend across the diameter of the bottom surface. Hence, the mechanical strength of the film can be increased to a great extent. Since the pores are oriented so as to become parallel with the surface of the substrate, a low, uniform dielectric constant is achieved in the direction perpendicular to the surface of the substrate. Particularly when the dielectric film is used as an interlayer dielectric film, the pores can assume a closed structure in which no opening sections are provided for upper layer wiring or lower layer wiring. Hence, the dielectric film plays the role of an effective low dielectric thin film having superior moisture resistance and enhanced reliability.

Preferably, the invention is characterized in that the inorganic dielectric film is formed on the surface of the substrate and includes a plurality of cyclic porous structure domains containing columnar pores oriented in one direction so as to become parallel with the surface of the substrate; and adjacent porous structure domains are oriented in different directions.

In addition to yielding the effect of increasing mechanical strength of the film, the configuration enables the opening sections of the pores to close each other, because the porous structure is oriented in a different direction in each domain. Hence, there can be obtained a low dielectric thin film having superior moisture resistance substantially equal to that of a dense film, superior mechanical strength derived from a cyclic structure, and an ultimately low dielectric constant.

Preferably, the invention is characterized in that the inorganic dielectric film is formed on the surface of the substrate and has layered pores and a cyclic porous structure including support members arranged in the layered pores so as to support an interlayer space.

Further, an interlayer space is supported by adjacent layers, and hence a layered cyclic porous geometry, which is usually considered to be unstable, can be constituted stably with superior mechanical strength. Particularly, the invention solves a problem of a dielectric film having a layered cyclic porous structure from among cyclic porous structures having a very high pore ratio but being thermally unstable and usually difficult to form. However, according to the configuration, a columnar structure of molecular size is included in the pore section of the layered cyclic porous structure, thereby enhancing thermal stability of the film and increasing the mechanical strength of the film to a great extent.

Preferably, the invention is characterized in that the inorganic dielectric film is formed on the surface of the substrate and includes a plurality of cyclic porous structure domains containing layered pores oriented so as to become parallel with the surface of the substrate; and adjacent porous structure domains are oriented in different directions.

According to the configuration, the porous structure domains are oriented on the molecular scale. However, the film is apparently made uniform on the scale of wiring. Various physical film properties, including electrical characteristics such as a relative dielectric constant, do not possess any anisotropy, and the film is uniform, thereby enabling practical use of the film. Particularly when the dielectric film is used as an interlayer dielectric film, the pores can assume a closed structure in which no opening sections are provided for upper layer wiring or lower layer wiring. Hence, the dielectric film plays the role of an effective low dielectric thin film having superior moisture resistance and enhanced reliability.

Preferably, the invention is characterized in that the inorganic dielectric film is a semiconductor substrate or a lower layer wiring conductor formed thereon, and an interlayer dielectric film is interposed between the semiconductor substrate or the lower layer wiring conductor, and an upper layer wiring conductor.

The configuration enables an attempt to lowers a dielectric constant of the interlayer dielectric film. Hence, a decrease in interlayer capacitance and provision of a semiconductor device which operates at high speed can be realized.

A method for manufacturing a semiconductor device according to the invention is characterized by comprising: a process of producing a precursor solution containing a silica derivative and a surface active agent; a contact process for bringing the precursor solution into contact with the surface of the substrate; a substitution process for replacing, through substitution, at least a portion of the surface active agent of the precursor solution with a compound constituting a support member of molecular size; and a process for sintering the substrate to decompose and remove the surface active agent, whereby a dielectric film is formed.

A method for manufacturing a semiconductor device according to the invention is characterized by comprising: a process of producing a precursor solution containing a silica derivative and a surface active agent; a preliminary crosslinking process which raises the temperature of the precursor solution, to thus initiate a crosslinking reaction; a contact process for bringing the precursor solution that has started the crosslinking reaction in the preliminary crosslinking process into contact with the surface of the substrate; a substitution process for replacing, through substitution, at least a portion of the surface active agent of the precursor solution with a compound constituting a support member of molecular size; and a process for sintering the substrate to decompose and remove the surface active agent.

According to the configuration, by means of inclusion of only a substitution process there can be provided a dielectric film which has extremely superior controllability, superior mechanical strength, and an ultimately low dielectric constant. Since the dielectric film can be formed at low temperature, a highly reliable dielectric film can be formed without affecting the substrate even when the dielectric film is used as an interlayer dielectric film of an integrated circuit.

Further, the pore ratio can be adjusted as required by adjusting the concentration of the precursor solution. A dielectric thin film of desired dielectric constant can be formed with extremely superior operability.

Preferably, the invention is characterized in that the substitution process is a process for replacing at least a portion of the surface active agent with an organic molecule.

Substitution employing organic molecules facilitates selection of molecules matching the pores, thereby enabling an attempt to easily increase mechanical strength.

Preferably, the invention is characterized in that the substitution process is a process for replacing at least a portion of the surface active agent with an inorganic molecule.

The configuration yields an effect of improving heat resistance.

Namely, in a case where the surface active agent is formed from cations, the surface active agent is subjected to ion exchange through use of a cationic inorganic compound. In contrast, in a case where the surface active agent is formed from anions, the surface active agent is subjected to ion exchange through use of an anionic inorganic compound. In a case where the surface active agent is neutral, the surface active agent is replaced with a neutral inorganic compound. In an ion exchange process, inorganic ions which exhibit interaction greater than that developing between ions of the surface active agent and the silica serving as a base material until exchange are used between the silica serving as the base material and the inorganic compound. As a result, ion exchange can be induced more efficiently.

Even when the surface active agent and the inorganic compound are exchanged with each other without involvement of ion exchange, exchange can be induced more efficiently, depending on the magnitude of interaction developing between the silica serving as the base material and the inorganic compound.

Further, a reaction which develops between surface active agent molecules and inorganic ions can also be replaced with a neutral inorganic compound. In this case, exchanging reaction is induced while electric charges are maintained by concurrent use of an acid or base, thereby enabling efficient exchange.

Preferably, the invention is characterized in that the substitution process is a process for replacing at least a portion of the surface active agent with an inorganic molecule.

Preferably, the invention is characterized in that the substitution process is a process for replacing the surface active agent with superfine particles of an inorganic compound.

When cetyltrimethyl ammonium bromide [CTAB: $C_{16}H_{33}N^+(CH_3)_3Br^-$] is employed as a surface active agent, an interval between layers before the substrate is subjected to sintering corresponds to two surface active agent molecules; that is, a distance of 2.5 nm or thereabouts. For this reason, an inorganic compound molecule of substantially equal size can be caused to approach the surface active agent molecule by utilization of a diffusion phenomenon attributable to a concentration gradient, to thereby enable replacement through ion exchange.

An inorganic compound molecule equal in size with the interval between the layers may be caused to approach the surface active agent molecule by utilization of the diffusion phenomenon attributable to a concentration gradient. An exchange phenomenon stemming from formation of a new link may also be utilized.

In relation to such a substitutional molecule, one molecule may correspond to the interval between the layers. However, an aggregate formed from a plurality of molecules, such as four or five molecules, may be used so as to correspond to a single interval between the layers.

When the diameter of the molecule is greater than the interval between the layers, substitution is effected such that the interval is made larger through exchange.

When the diameter of the molecule is almost equal to the interval between the layers, substitution is effected such that the interval remains substantially constant through exchange.

When the diameter of the molecule is smaller than the interval between the layers, substitution is effected such that the interval becomes smaller through exchange.

Preferably, the invention is characterized in that the inorganic compound is hydrated magnesia $(MgO)_m(H_2O)_n$.

The magnesia molecules $(MgO)_m(H_2O)_n$ remain hydrated in a solution. Surfaces of the particles are charged positive δ+, and δ− oxygen atoms of $H_2O$ or OH are coordinated with the surfaces. The magnesia molecules may be formed from linear or oval MgO superfine particles or a cluster which constitutes an agglomerate of molecules. Preferably, the molecules assume a diameter of 10 nm or less, more preferably a diameter of 4 nm or less.

Preferably, the invention is characterized in that the substitution process includes a process for growing the inorganic compound molecules in the pores through diffusion.

Preferably, the invention is characterized in that the substitution process includes a process for replacing, through substitution, a single or a plurality of straight chain silanol molecules produced from hydrolysis polycondensation reaction of silicon-hydroxide-based molecules.

Preferably, the invention is characterized in that the contact process is a process for immersing the substrate into the precursor solution.

The configuration enables formation of a low dielectric thin film with superior productivity.

Preferably, the invention is characterized in that the contact process is a process for immersing the substrate into the precursor solution and raising the substrate at a desired speed.

The configuration enables formation of a low dielectric thin film with superior productivity.

Preferably, the invention is characterized in that the contact process is a process for applying the precursor solution over the substrate.

The configuration enables formation of a low dielectric thin film with superior productivity.

Preferably, the invention is characterized in that the contact process is a spin coating process for dropping the precursor solution on the substrate and spinning the substrate. The configuration enables easy adjustment of a film thickness or a pore ratio and formation of a low dielectric thin film with superior productivity.

BRIEF DESCRIPTION OF THE DRAWINGS

FIGS. 15(a)-15(h) are views showing an interlayer dielectric film according to a seventh embodiment of the invention;

FIGS. 23(a)-23(f) are descriptive views showing the interlayer dielectric film of the fourteenth embodiment of the invention;

Figure 1:
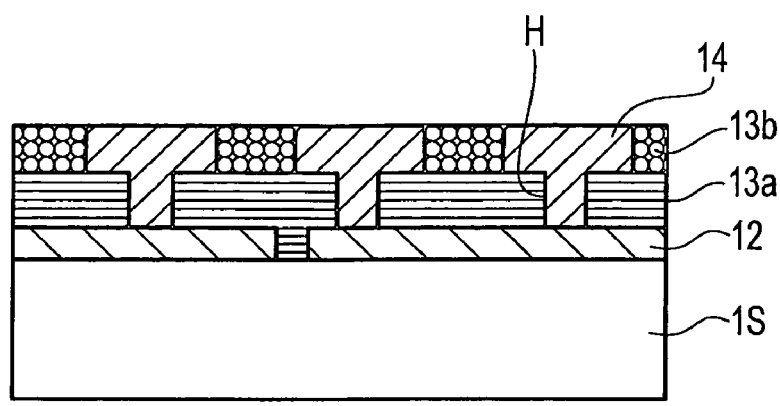
FIG. 1 is a view showing a semiconductor device of multilayer wiring structure using a dielectric film formed by means of a method according to a first embodiment of the invention.

In the drawings,
15 SILICON SUBSTRATE
12 FIRST WIRING LAYER
13a FIRST INTERLAYER DIELECTRIC FILM
13b SECOND INTERLAYER DIELECTRIC FILM
135 SECOND INTERLAYER DIELECTRIC FILM
14 SECOND WIRING LAYER
H CONTACT HOLE
1 SILICON SUBSTRATE
2 ELEMENT ISOLATION DIELECTRIC FILM
3 GATE DIELECTRIC FILM
4 GATE ELECTRODE
5 SOURCE REGION
6 DRAIN REGION
7 DIELECTRIC FILM
8 CONTACT HOLE
9 LOWER ELECTRODE
10 FERROELECTRIC FILM
11 UPPER ELECTRODE

BEST MODES FOR IMPLEMENTING THE INVENTION

First Embodiment

A semiconductor device of multilayer wiring structure using a low dielectric thin film as an interlayer dielectric film will be described as a first embodiment of the invention.

As shown in FIG. 1, the semiconductor device is characterized in that an interlayer dielectric film is formed from a dielectric film having a two-layer structure and a low dielectric constant; that a first interlayer dielectric film 13a having contact holes H to contact a first wiring layer 12 is formed from a second porous structure domain in which layered pores are arranged cyclically so as to become parallel with the surface of a substrate; and that a second interlayer dielectric film 13b—which is formed on the first interlayer dielectric film 13a, serves as an upper-layer portion, and is charged into inter-wiring regions of a second wiring layer 14—is formed from a first porous structure domain in which columnar pores are arranged cyclically.

Specifically, a lower layer portion of the interlayer dielectric film—which is formed between the first wiring layer 12 formed on the surface of an element region enclosed with an element isolation dielectric film (not shown) formed on the surface of a silicon substrate 1S and the second wiring layer 14—is taken as a first interlayer dielectric film 13a in which layered pores are arranged cyclically so as to become parallel with the surface of the substrate. The second interlayer dielectric film 13b—which serves as an upper layer portion and is formed in a region between wiring patterns of the second wiring layer 14 as an inter-line dielectric film—is formed from a first porous structure domain in which columnar pores are arranged cyclically.

The other portions of the semiconductor device are of ordinary structure, and their illustrations and explanations are omitted.

Processes of manufacturing the interlayer dielectric film will now be described by reference to FIGS. 2A through 2D.

Figure 2:
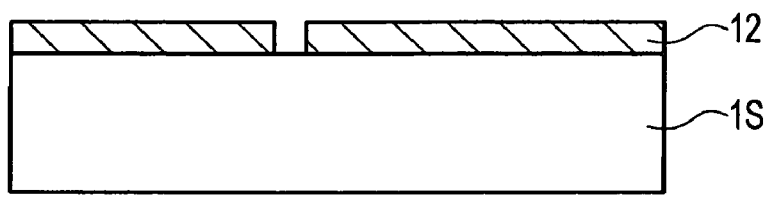
FIGS. 2(a)-2(d) are views showing processes for manufacturing the semiconductor device of multilayer wiring structure shown in FIG. 1.
Figure 2:
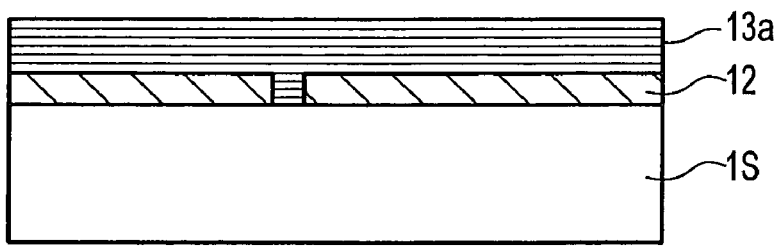
Figure 2:
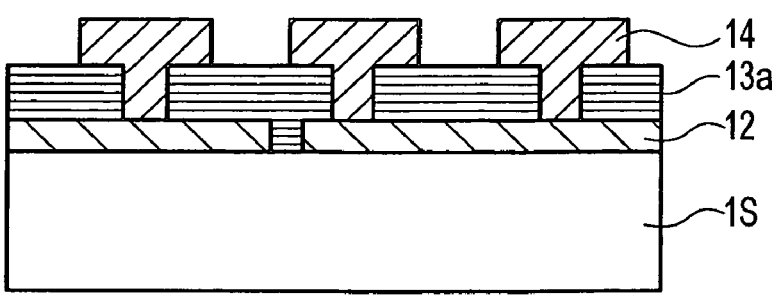
Figure 2:
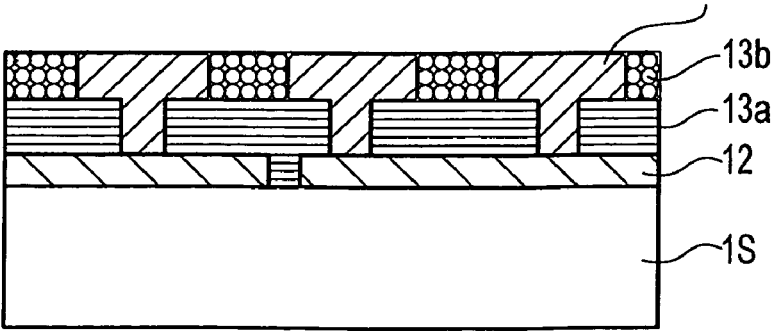

As shown in FIG. 2A, a desired semiconductor region is formed on the surface of the silicon substrate 1S by means of an ordinary method, thereby forming a first wiring layer.

Subsequently, under the method of the invention, there is formed a mesoporous silica thin film in which the layered pores are arranged cyclically so as to become parallel with the surface of the substrate and which is formed from a second cyclic porous structure domain (FIG. 2B).

Figure 3:
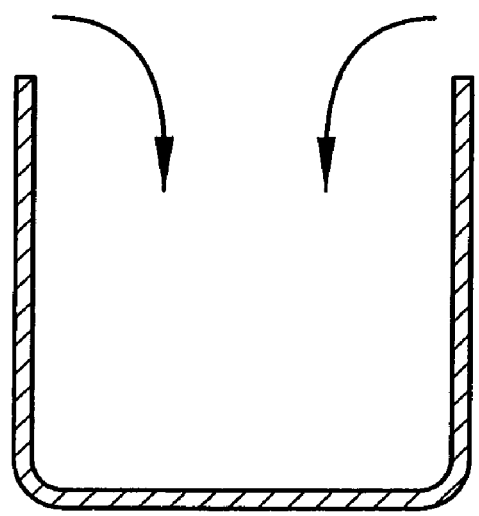
FIGS. 3(a)-3(b) are descriptive views showing processes for forming the dielectric film of the first embodiment of the invention.
Figure 3:
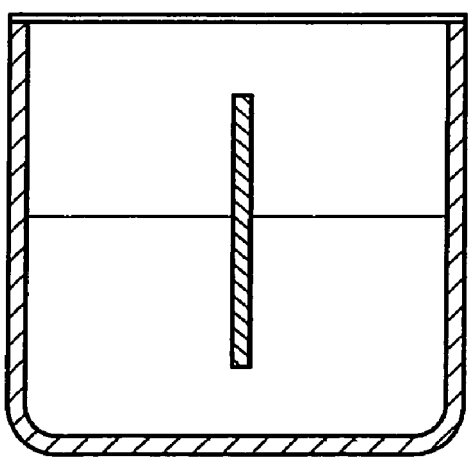

Specifically, as shown in FIG. 3A, cationic cetyltrimethyl ammonium bromide [CTAB: $C_{16}H_{33}N^+(CH_3)_3Br^-$] serving as a surface active agent; tetramethoxy silane (TMOS) serving as a silica derivative; and hydrochloric acid (HCl) serving as an acid catalyst are dissolved into an $H_2O$/alcohol mixed solvent, thereby preparing a precursor solution within a mixing container. Mole ratios employed for preparing the precursor solution are determined such that 0.5 parts surface active agent, 5 parts silica derivative, and 2 parts acid catalyst are mixed together, with the solution being taken as 100 parts. The substrate having the first wiring layer 12 formed thereon is immersed in the mixture of solutions. As shown in FIG. 3B, after the mixing container has been sealed, the mixture is maintained at 30° C. to 150° C. for one to 120 hours, whereby the silica derivative is subjected to polymerization through hydrolysis polycondensation reaction (a preliminary crosslinking process), thereby forming a cyclic self-agglomerate of the surface active agent.

Figure 4:
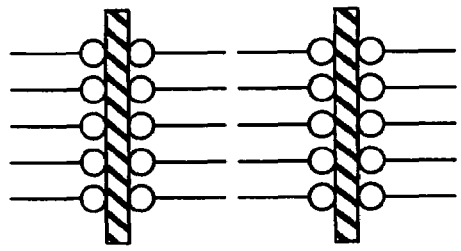
FIGS. 4(a)4(f) are descriptive views showing an interlayer dielectric film of the first embodiment of the invention.
Figure 4:
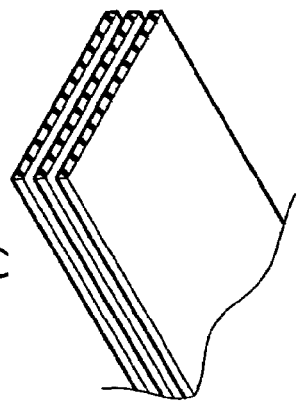
Figure 4:
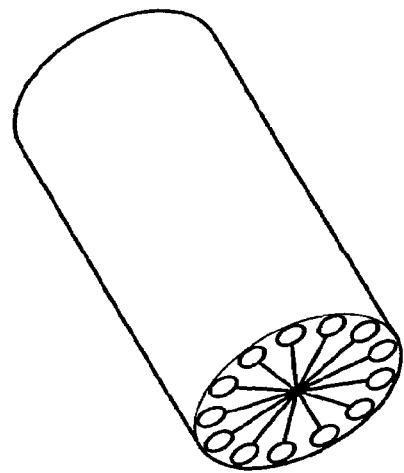
Figure 4:
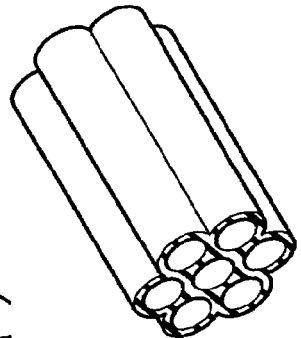
Figure 4:
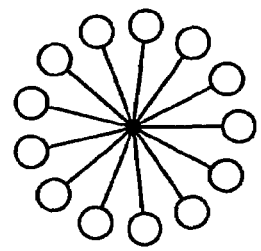
Figure 4:
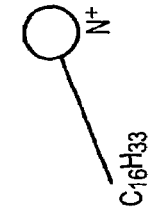

As shown in FIG. 4A, the self-agglomerate forms a spherical micelle structure (FIG. 4B) into which a plurality of molecules, each comprising $C_{16}H_{33}N^+(CH_3)_3Br^-$, coagulate. There is formed a laminated structure (FIG. 4D) in which the surface active agent is oriented as the degree of coagulation is increased as a result of an increase in density (FIG. 4C).

The substrate is raised and subjected to rinsing and drying. Subsequently, the substrate is heated and sintered for three hours in an oxygen atmosphere at 400° C., thereby completely removing the surface active agent remaining in a mold through thermal decomposition. A pure mesoporous silica thin film is formed.

As shown in FIG. 2B, thus is formed the first interlayer dielectric film 13a in which the layered pores parallel with the surface of the substrate are arranged. An enlarged descriptive view of the first interlayer dielectric film is shown in FIG. 4F. Here, a self-agglomerate of high density, such as that shown in FIG. 4D, is formed. An inorganic dielectric film in which layered pores are arranged can be formed by sintering the self-agglomerate.

As shown in FIG. 2C, through holes H are formed in the first interlayer dielectric film 13a, and the second wiring layer 14 is formed by means of the ordinary method.

Subsequently, the second interlayer dielectric film 13b is formed. The second interlayer dielectric film is formed in the same manner as in the process for forming the first interlayer dielectric film 13a. However, there is employed a precursor solution whose composition is changed from that of the precursor solution employed for forming the first interlayer dielectric film. Here, mole ratios employed for preparing the precursor solution are determined such that 0.05 parts surface active agent, 0.1 parts silica derivative, and 2 parts acid catalyst are mixed together with the solution being taken as 100 parts. In other respects, the second interlayer dielectric film is formed in totally the same manner as that employed for forming the first interlayer dielectric film.

As shown in FIG. 2D, there is obtained the second interlayer dielectric film 13b formed from the first porous structure domain, wherein columnar pores are cyclically arranged.

Here, a spherical micelle structure into which a plurality of molecules, each comprising $C_{16}H_{33}N^+(CH_3)_3Br^-$, coagulate is further increased in density, thereby forming a cylindrical substance in which pores are oriented. Thus, a self-agglomerate such as that shown in FIG. 4C is formed and sintered. Thus, there is obtained the second interlayer dielectric film 13b formed from the first porous structure domain, such as that shown in FIG. 4E, wherein columnar pores are cyclically arranged.

Figure 5:
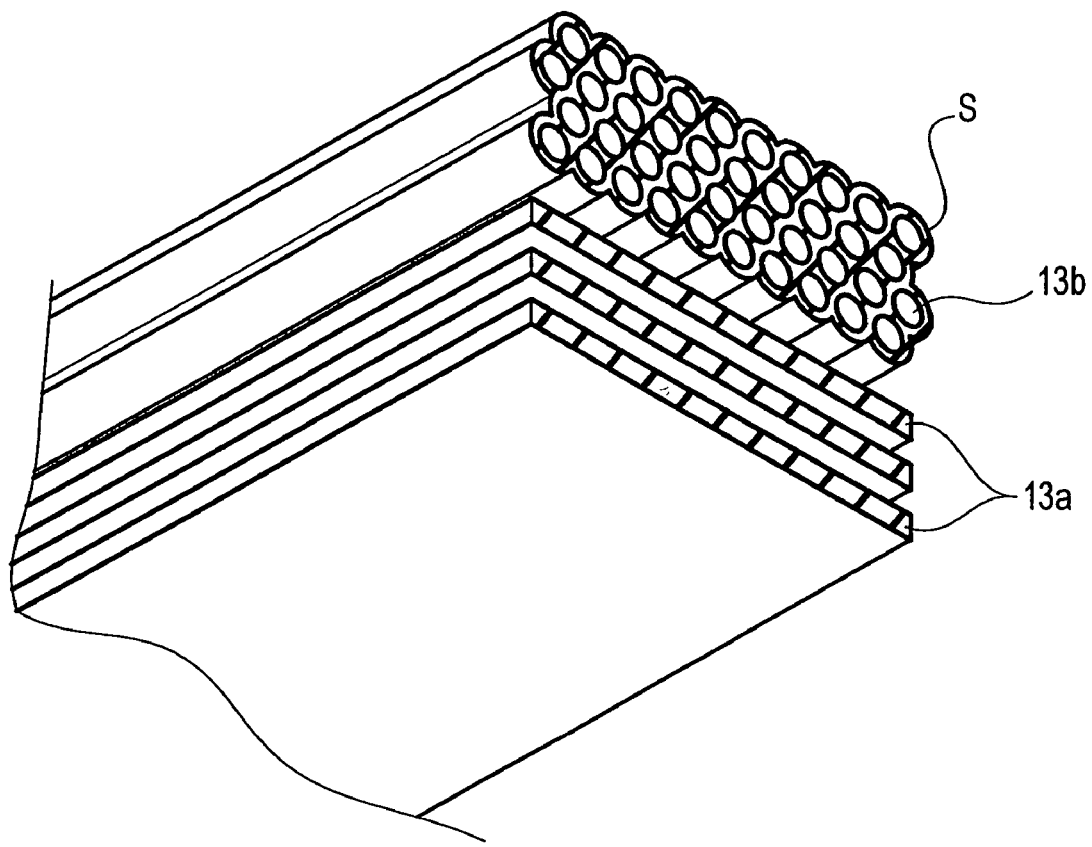
FIG. 5 is a structural descriptive view showing the interlayer dielectric film of the first embodiment of the invention.

FIG. 5 is a structural descriptive view showing a cross section of the substrate in this state. As is evident from the drawing, the multilayer wiring structure is understood to comprise the first interlayer dielectric film 13a formed from a porous thin film having pores opened in the layered pattern, and the second interlayer dielectric film 13b in which columnar pores are cyclically arranged.

In relation to the semiconductor device having the thus-formed multilayer wiring structure, the interlayer dielectric film constitutes, in the region surrounding the contact holes H, the second porous structure domain in which the layered pores are arranged cyclically. Hence, the interlayer capacitance can be diminished. Further, the columnar pores are arranged between wiring patterns within an upper layer wiring region constituting an inter-wiring dielectric film, and hence inter-wiring capacitance is lowered. In the inter-wiring dielectric film serving as the upper-layer-side second interlayer dielectric film, the columnar pores are oriented so as to become parallel with the direction in which a wiring pattern of the second wiring layer 14 is arranged. Hence, there can be provided a semiconductor device having high reliability without involvement of a problem of occurrence of a short circuit between wiring patterns.

Second Embodiment

In the first embodiment, the interlayer dielectric film is formed from a dielectric film having a two-layer structure and a low dielectric constant. A lower layer portion of the interlayer dielectric film is formed from the second porous structure domain in which layered pores are arranged cyclically so as to become parallel with the surface of the substrate. An upper layer portion of the interlayer dielectric film is formed from the first porous structure domain in which the columnar pores are arranged cyclically. However, the upper layer portion of the interlayer dielectric film may be formed from a third porous structure domain which is perpendicular to the surface of the substrate and runs in parallel with a main wiring pattern, instead of the porous structure domain having the columnar pores.

Figure 6:
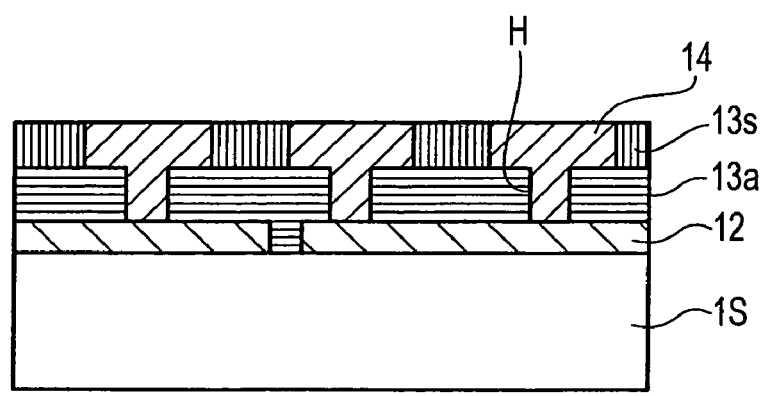
FIG. 6 is a descriptive view showing a semiconductor device according to a second embodiment of the invention.

The structure of the third porous structure domain is shown in FIG. 6. As shown in FIG. 6, the semiconductor device is characterized in that the interlayer dielectric film is formed from a dielectric film having a two layer structure and a low dielectric constant; that the first interlayer dielectric film 13a having the contact holes H that contact the first wiring layer 12 is formed from the second porous structure domain in which layered pores are arranged cyclically so as to become parallel with the surface of the substrate; and that a second interlayer dielectric film 13S which is to be formed on the first interlayer dielectric film 13a, serves as an upper layer portion, and is charged into an inter-wiring region of the second wiring layer 14 is formed from the third porous structure domain in which columnar pores are arranged cyclically.

Specifically, a lower layer portion of the interlayer dielectric film—which is formed between the first wiring layer 12 formed on the surface of an element region enclosed with the element isolation dielectric film (not shown) formed on the surface of the silicon substrate 11 and the second wiring layer 14—is taken as the first interlayer dielectric film 13a in which layered pores are arranged cyclically so as to become parallel with the surface of the substrate. The second interlayer dielectric film 13S—which serves as an upper layer portion and is formed in a region between wiring patterns of the second wiring layer as an inter-line dielectric film—is formed from the third porous structure domain which is perpendicular to the surface of the substrate and runs in parallel with the main wiring pattern.

The other portions of the semiconductor device are formed in totally the same manner as in the case of the first embodiment, and their illustrations and explanations are omitted.

By means of such a configuration, the inter-wiring capacitance can be lowered further. Since the third porous structure domain runs in parallel with the main wiring pattern, a multilayer insulation wall is present between wiring patterns, whereby occurrence of a short circuit between wiring patterns can be prevented more reliably.

Third Embodiment

FRAM using a low dielectric thin film as an interlayer dielectric film is described as a third embodiment of the invention.

As shown in FIG. 7A, the FRAM comprises a switching transistor fabricated in the element region enclosed with a element isolation dielectric film 2 formed on the surface of a silicon substrate 1, and a ferroelectric capacitor. The invention is characterized by use of a thin film 7 of low dielectric constant of the invention as an interlayer dielectric film between the switching transistor and a lower electrode 9 of the ferroelectric capacitor. As shown in an enlarged perspective view of the featured section shown in FIG. 7B, the low dielectric thin film is formed by repeatedly laminating, on the surface of the substrate in a vertical position, a first porous structure domain 7c in which columnar pores are arranged cyclically, and a second porous structure domain 7s in which layered pores are cyclically arranged in parallel with the surface of the substrate.

By means of such a configuration, particularly when the low dielectric thin film is used as an interlayer dielectric film, the pores can assume a closed structure in which no opening sections are provided for an upper layer wiring pattern or a lower layer wiring pattern. Thus, the interlayer dielectric film plays the role of a low dielectric thin film which has superior moisture resistance and extremely high reliability.

The other portions of the interlayer dielectric film are formed by means of the ordinary method. The switching transistor has a gate electrode formed on the surface of the silicon substrate 1 by way of a gate dielectric film 3, and a source region 5 and a drain region 6 formed such that the gate electrode is sandwiched therebetween. The lower electrode 9 is connected to the drain region 6 by way of a contact 8. The source and drain regions are connected to a bit line BL.

The ferroelectric capacitor is formed from a ferroelectric thin film 10 which is formed from a PZT between the lower electrode 9 and an upper electrode 11.

Processes for manufacturing the FRAM will be described by reference to FIGS. 8A to 8D.

First, by means of the ordinary method, the gate electrode 4 is formed on the surface of the silicon substrate 1 by way of the gate dielectric film 3. The substrate is subjected to diffusion of impurities while the gate electrode is taken as a mask, thereby forming the source region 5 and the drain region 6 (FIG. 8A).

Figure 8:
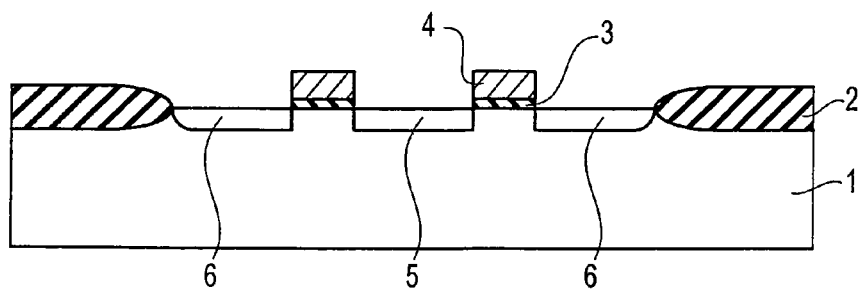
FIGS. 8(a)-8(d) are views showing processes for manufacturing the FRAM shown in FIG. 7.
Figure 8:
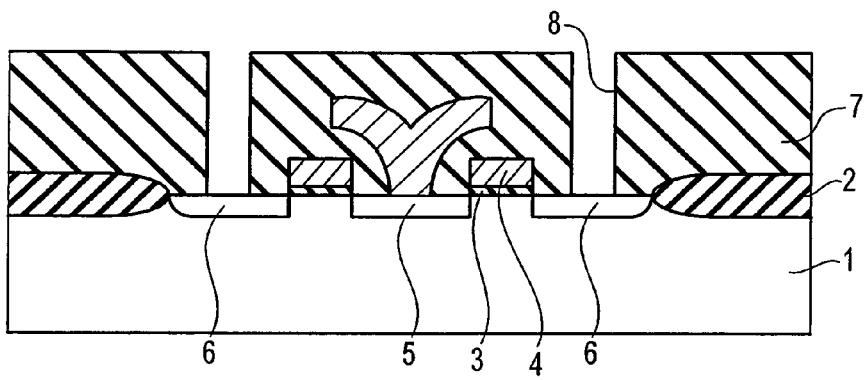
Figure 8:
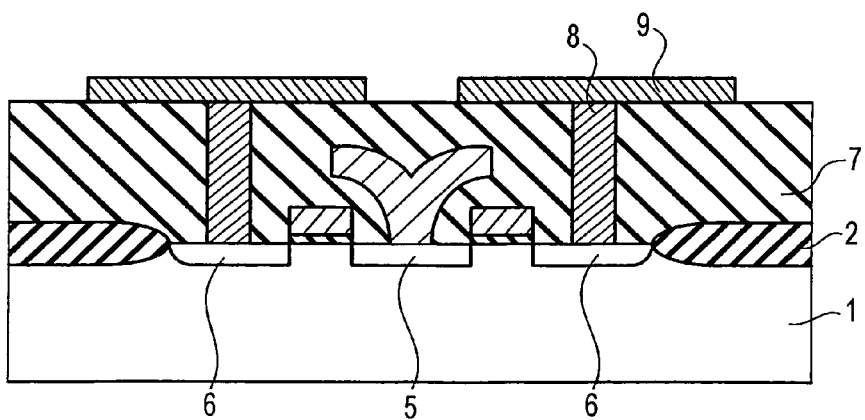
Figure 8:
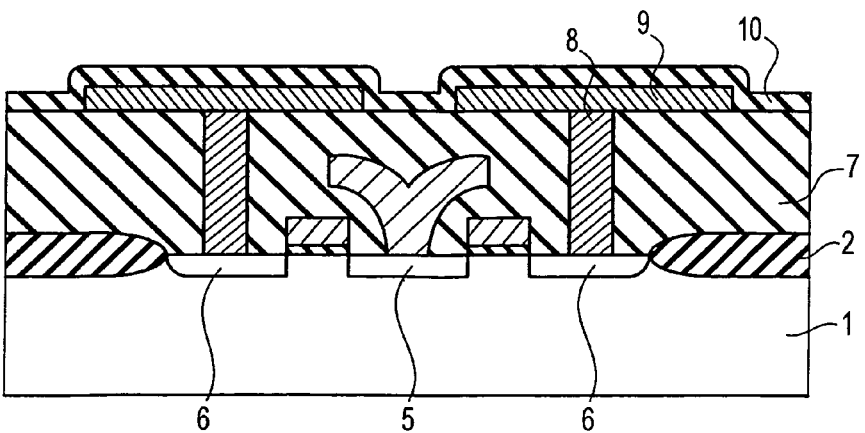

Subsequently, under the method of the invention, a mesoporous silica thin film is formed to include a plurality of cyclic porous structure domains containing columnar pores oriented in one direction so as to become parallel with the surface of the substrate (FIG. 8B).

Figure 9:
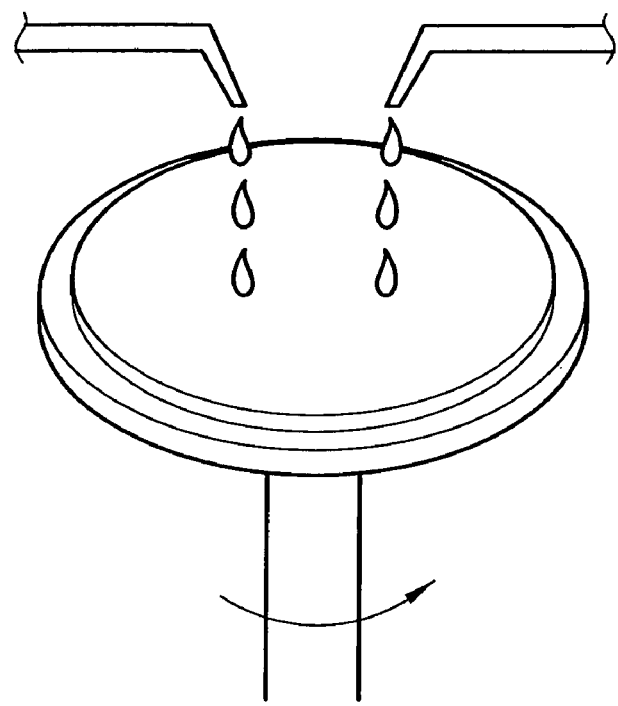
FIG. 9 is a descriptive view showing processes for forming the dielectric film of the third embodiment of the invention.

Specifically, as shown in FIG. 3A, cationic cetyltrimethyl ammonium bromide [CTAB: $C_{16}H_{33}N^+(CH_3)_3Br^-$] serving as a surface active agent; tetramethoxy silane (TMOS) serving as a silica derivative; and hydrochloric acid (HCl) serving as an acid catalyst are dissolved into an $H_2O$/alcohol mixed solvent, thereby preparing a precursor solution within a mixing container. Mole ratios employed for preparing the first precursor solution are determined such that 0.05 parts surface active agent, 0.1 parts silica derivative, and 2 parts acid catalyst are mixed together with the solution being taken as 100 parts. Mole ratios employed for preparing the second precursor solution are determined such that 0.5 parts surface active agent, 1 part silica derivative, and 2 parts acid catalyst are mixed together with the solution being taken as 100 parts. As shown in FIG. 9, the thus-formed first and second precursor solutions are dropped onto the surface of the substrate 1 placed on a spinner by way of respective nozzles. The substrate is spun at 500 to 5000 rpm, to thus form a mesoporous silica thin film. The mesoporous silica thin film is at 30° C. to 150° C. for one to 120 hours, whereby the silica derivative is subjected to polymerization through hydrolysis polycondensation reaction (a preliminary crosslinking process), thereby forming a mesoporous silica thin film while a cyclic self-agglomerate of the surface active agent is taken as a mold. Here, the preliminary crosslinking process is performed preferably at 60° C. to 120° C., more preferably at 70° C. to 90° C., for about 12 to 72 hours.

Finally, as in the case of the first embodiment, the substrate is sintered so as to completely thermally decompose and remove the surface active agent, thus forming a pure mesoporous silica thin film.

In this way, the thin film 7 of low dielectric constant of the embodiment is formed. In fact, in order to form a bit line BL, the low dielectric thin film must be formed twice. An interlayer dielectric film of two-layer structure having different layouts of pores may be formed by use of precursor solutions of different composition ratios before and after formation of the bit line BL.

In the embodiment, the substrate is subjected to preliminary crosslinking after the precursor solution has been applied over the surface of the substrate. However, the precursor solution may be applied over the surface of the substrate after the substrate has been subjected to crosslinking. By means of such a configuration, the precursor solutions hardly become mixed together and can maintain their own states. For this reason, an interlayer dielectric film having a plurality of cyclic porous structures can be formed more easily.

Subsequently, as shown in FIG. 8B, by means of the ordinary method, contact holes 8 are formed in the thin film 7 of low dielectric constant. After plugs have been formed by embedding a highly-doped polycrystalline silicon layer in the respective contact holes, an iridium oxide layer is formed through use of a gas mixture consisting of argon and oxygen while iridium is used as a target. A platinum layer is formed on the iridium oxide layer while platinum is used as a target. In this way, as shown in FIG. 8C, the iridium oxide layer having a thickness of about 50 nm and the platinum layer having a thickness of about 200 nm are formed. These layers are patterned through photolithography, to thereby form the lower electrodes 9.

A PZT film is formed on the lower electrodes 9 as the ferroelectric film 10 by means of a sol-gel method. A mixed solution of $Pb(CH_3COO)_2 \cdot 3H_2O, Zr(t-OC_4H_9)_4, Ti(i-OC_3H_7)_4$ is used as a starting material. After the mixed solution has been applied over the substrate through spin coating, the substrate is dried at 150° C. and subjected to temporal sintering for 30 minutes at 400° C. in a dry air atmosphere. After having been repeatedly subjected to these operations five times, the substrate is subjected to heat treatment at a temperature of 700° C. or greater in an $O_2$ atmosphere. Thus, the ferroelectric film 10 having a thickness of 250 nm is formed. Here, the PZT film is formed while "x" in $PbZr_xTi_{1-x}O_3$ is taken as 0.52 [hereinafter expressed as PZT (52/48)] (FIG. 8D)

Figure 7:
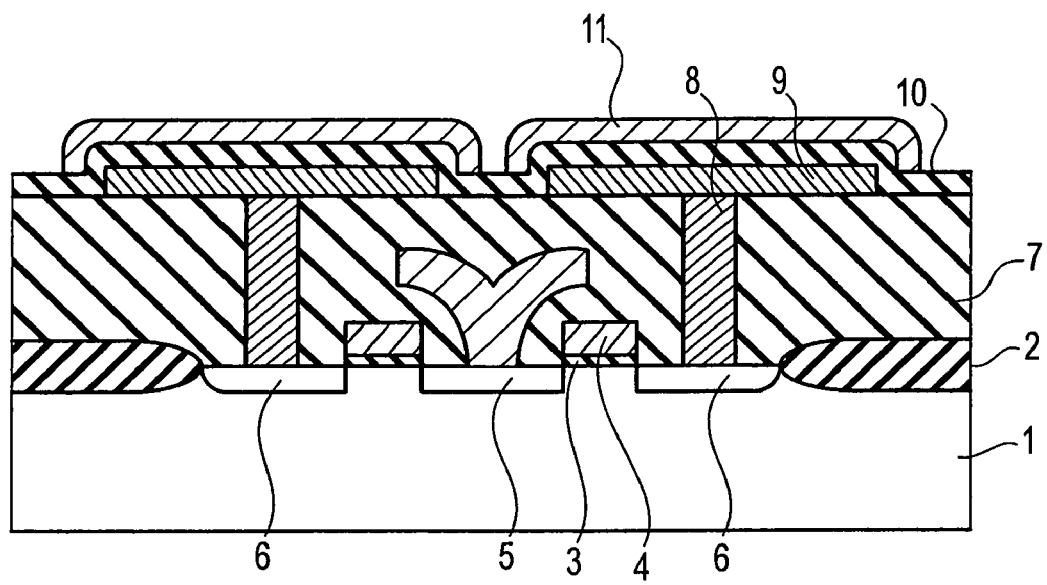
FIGS. 7(a)-7(b) are views showing FRAM using a dielectric film formed by means of a method according to a third embodiment of the invention.
Figure 7:
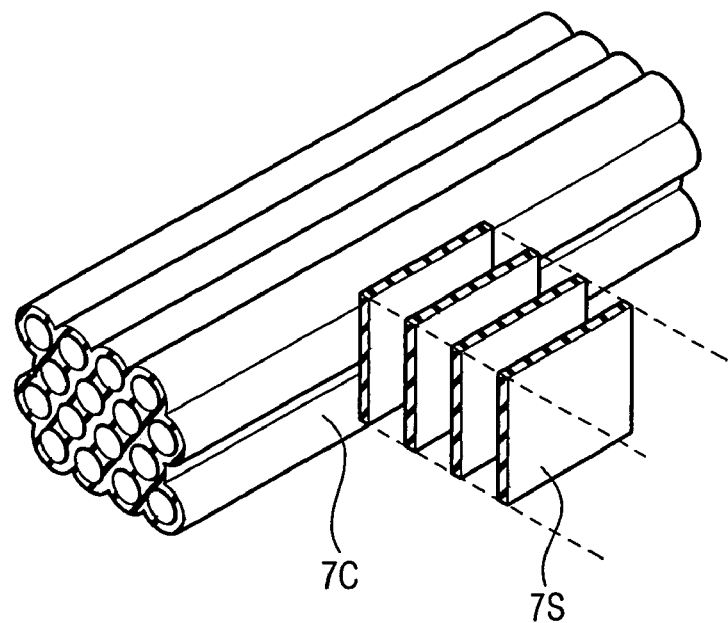

A laminated film 11 consisting of iridium oxide and iridium is formed on the ferroelectric film 10 by means of sputtering. The laminated film consisting of an iridium oxide layer and an iridium layer is taken as an upper electrode 11. The iridium layer and the iridium oxide layer are formed to a total thickness of 200 nm. Thus, a ferroelectric capacitor can be obtained, and the FRAM shown in FIG. 7 is formed.

By means of such a configuration, the interlayer dielectric film is formed from a low dielectric thin film formed from the mesoporous silica thin film. Hence, capacitance attributable to the interlayer dielectric film is diminished, and there can be formed FRAM whose switching characteristic is good and which can operate at high speed.

By virtue of a cyclic porous structure, the mechanical strength of the dielectric film can be enhanced, and the dielectric film of high reliability can be obtained. The first porous structure domain having columnar pores cyclically arranged therein and the second porous structure domain having layered pores cyclically arranged on the surface of the substrate in a vertical direction are arranged repeatedly. The pores can assume a closed structure in which no opening sections are provided for the upper and lower wiring. The interlayer dielectric film plays the role of a low dielectric thin film which has superior moisture resistance and high reliability. Accordingly, no leak current arises, and the interlayer dielectric film has longer life.

The composition of the first precursor solution is not limited to the composition employed in the embodiment. Under the assumption that the solution assumes a value of 100, the surface active agent preferably assumes a value of 0.01 to 0.1; the silica derivative preferably assumes a value of 0.01 to 0.5; and the acid catalyst preferably assumes a value of 0 to 5. Use of the precursor solution having the composition enables formation of a dielectric film of low dielectric constant having columnar pores.

The composition of the second precursor solution is not limited to that employed in the embodiment. Under the assumption that the solution assumes a value of 100, the surface active agent preferably assumes a value of 0.1 to 10; the silica derivative preferably assumes a value of 0.5 to 10; and the acid catalyst preferably assumes a value of 0 to 5. Use of the precursor solution having the composition enables formation of a dielectric film of low dielectric constant having layered pores.

In the embodiment, cationic cetyltrimethyl ammonium bromide [CTAB: $C_{16}H_{33}N^+(CH_3)_3Br^-$] is used as a surface active agent. It goes without saying that the surface active agent is not limited to such an agent and that another surface active agent may be employed.

Use of alkali ions, such as Na ions, as catalysts deteriorates a semiconductor material. Therefore, use of a cationic surface active agent and use of an acid catalyst are preferable. In addition to HCl, nitric acid ($HNO_3$), sulfuric acid ($H_2SO_4$), phosphoric acid ($H_3PO_4$), $H_4SO_4$, or the like may also be used as the acid catalyst.

The silica derivative is not limited to TMOS. Silicon alkoxide material, such as tetraethoxy silane (TEOS), is preferably used.

Further, the water $H_2O$/alcohol mixed solvent is used as a solvent. However, it may be the case that only water is used.

Moreover, although an oxygen atmosphere is used as a sintering atmosphere, sintering may be performed in the atmosphere, under reduced pressure, or in a nitrogen atmosphere. Preferably, use of a foaming gas formed from a gas mixture consisting of nitrogen and hydrogen enhances moisture resistance, thereby enabling an attempt to reduce a leakage current.

A mixing ratio of the surface active agent, the silica derivative, the acid catalyst, and the solvent can be changed as required.

The preliminary polymerization process is performed at 30° C. to 150° C. for one through 120 hours. The temperature is desirably set to 60° C. to 120° C., and more preferably to 90° C.

The sintering process is performed for one hour at 400° C. However, sintering may be performed at 300° C. to 500° C. for one to five hours or thereabouts. Preferably, the temperature is set to 350° C. to 450° C.

Fourth Embodiment

Figure 10:
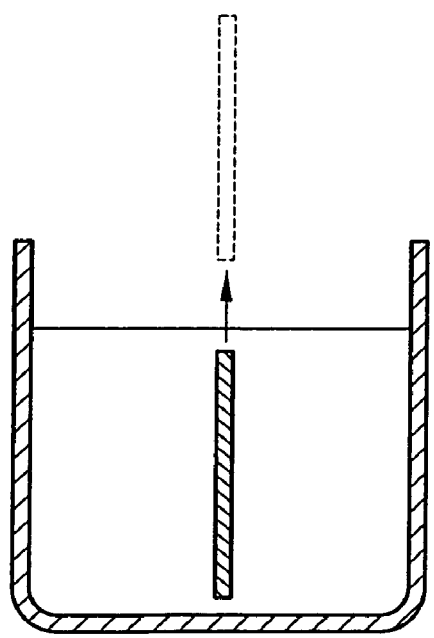
FIG. 10 is a descriptive view showing a method for forming a dielectric film according to a fourth embodiment of the invention.

In the first embodiment, the mesoporous silica thin film is formed by immersing the substrate into the precursor solution. However, formation of the mesoporous silica thin film is not limited to immersion. As shown in FIG. 10, a dip coating method may also be employed.

Specifically, the substrate is lowered to a liquid level of the prepared precursor solution at right angles at a speed of 1 mm/s through 10 m/s until it sinks in the solution, and is left stationary for one second to one hour.

After lapse of a desired period of time, the substrate is raised at right angles and at a rate of 1 mm/s through 1.0 m/s until being taken out of the solution.

Finally, as in the case of the first embodiment, the substrate is subjected to sintering, to thereby completely thermally decompose and remove the surface active agent and produce a pure mesoporous silica thin film.

At the time of formation of the precursor solution, the structure of the resultant structural body is known to change according to a proportion of the surface active agent to the silica derivative.

For instance, when a molecular ratio of the surface active agent to the silica derivative, such as CATB/TEOS, assumes a value of 0.3 to 0.8, a network structure (cubic structure) is known to be obtained. If the molecular ratio is lower than this molecular ratio and assumes a value of 0.1 to 0.5, there is obtained a dielectric film of low dielectric constant in which columnar pores are oriented. In contrast, when the molecular ratio is greater than that molecular ratio and assumes a value of 0.5 to 2, there is obtained a dielectric film of low dielectric constant in which layered pores are oriented.

The embodiment has described the coating method using the spinner. However, a so-called brush painting method for applying a solution with a brush is also applicable.

The embodiment has described the interlayer dielectric film of FRAM. However, the invention can also be applied to various semiconductor devices using silicon; a high-speed device including a device, such as HEMT, which uses a compound semiconductor; a high-frequency device such as a microwave IC; highly-integrated ferroelectric memory of MFMIS type; and a microwave transmission line or multi-layer wiring board using a film carrier or the like.

Particularly, an effective low dielectric thin film can be obtained as an interlayer dielectric film.

Fifth Embodiment

FRAM using a low dielectric thin film as an interlayer dielectric film is described as a fifth embodiment of the invention.

Figure 11:
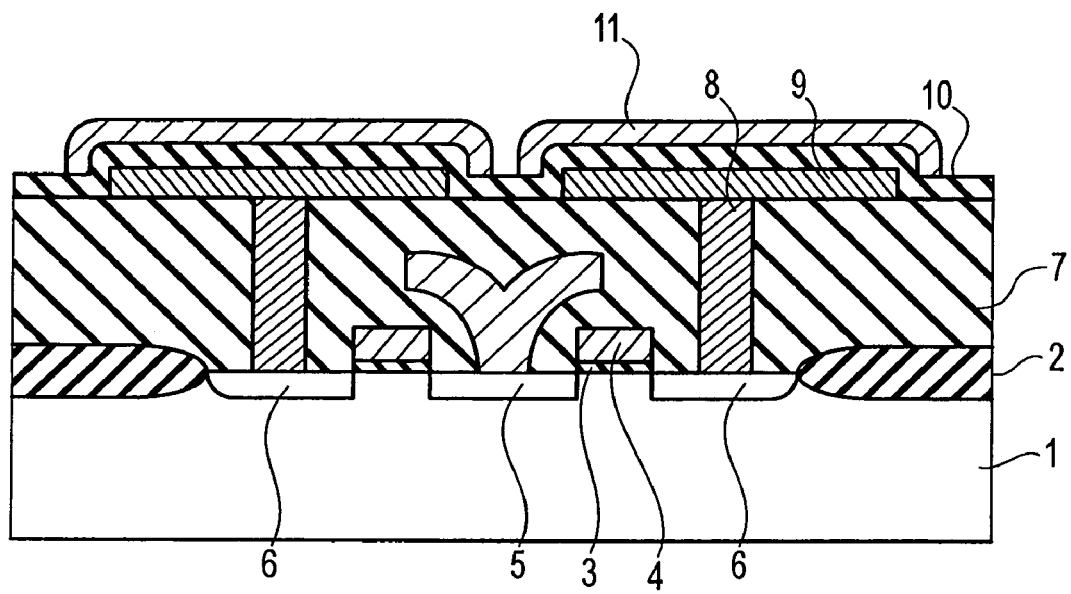
FIGS. 11(a)-11(b) are views showing FRAM using the dielectric film formed by means of a method according to a fifth embodiment of the invention.
Figure 11:
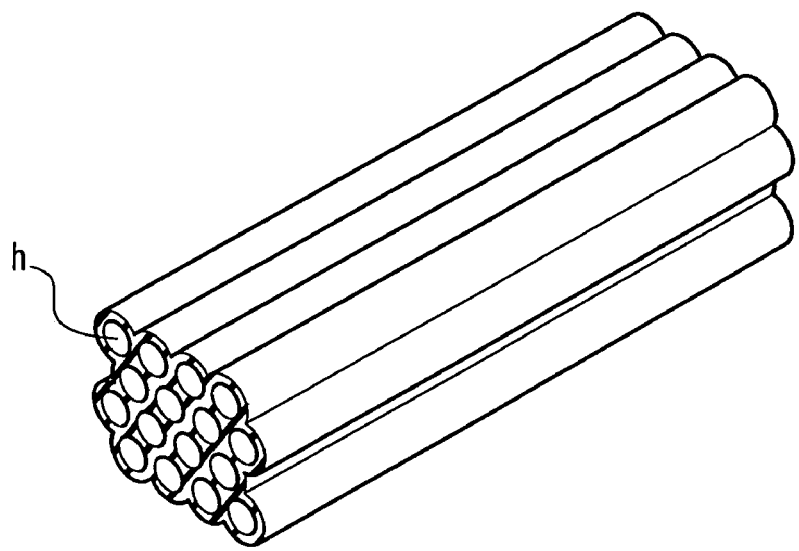

As shown in FIGS. 11A and 11B, the FRAM comprises a switching transistor fabricated in the element region enclosed with the element isolation dielectric film 2 formed on the surface of the silicon substrate 1, and the ferroelectric capacitor. The invention is characterized by use of the thin film 7 of low dielectric constant of the invention as an interlayer dielectric film between the switching transistor and the lower electrode 9 of the ferroelectric capacitor. As shown in an enlarged perspective view of the featuring section shown in FIG. 11B, the low dielectric thin film is formed from a mesoporous silica thin film formed so as to include a plurality of cyclic porous structure domains containing columnar pores "h" which are oriented in one direction so as to become parallel with the surface of the substrate.

The other portions of the interlayer dielectric film are formed by means of the ordinary method. The switching transistor has a gate electrode formed on the surface of the silicon substrate 1 by way of the gate dielectric film 3, and the source region 5 and the drain region 6 formed such that the gate electrode is sandwiched therebetween. The lower electrode 9 is connected to the drain region 6 by way of the contact 8. Source and drain regions are connected to a bit line BL.

The ferroelectric capacitor is formed from a ferroelectric thin film 10 which is formed from a PZT between the lower electrode 9 and the upper electrode 11.

Processes for manufacturing the FRAM will be described by reference to FIGS. 4A to 4D, which have already been described in connection with the first embodiment.

First, under the ordinary method, the gate electrode 4 is formed on the surface of the silicon substrate 1 by way of the gate dielectric film 3. The substrate is subjected to diffusion of impurities while the gate electrode is taken as a mask, thereby forming the source region 5 and the drain region 6 (FIG. 4A).

Subsequently, under the method of the invention, a mesoporous silica thin film is formed to include a plurality of cyclic porous structure domains containing columnar pores oriented in one direction so as to become parallel with the surface of the substrate (FIG. 4B).

Specifically, as shown in FIG. 2A, cationic cetyltrimethyl ammonium bromide [CTAB: $C_{16}H_{33}N^+(CH_3)_3Br^-$] serving as a surface active agent; tetramethoxy silane (TMOS) serving as a silica derivative; and hydrochloric acid (HCl) serving as an acid catalyst are dissolved into an $H_2O$/alcohol mixed solvent, thereby preparing a precursor solution within a mixing container. Mole ratios employed for preparing the precursor solution are determined such that 0.05 parts surface active agent, 0.1 parts silica derivative, and 2 parts acid catalyst are mixed together with the solution being taken as 100 parts. The substrate in which the MOSFET is fabricated is immersed in the mixed solution. As shown in FIG. 2B, after the mixing container has been sealed, the mesoporous silica thin film is maintained at 30° C. to 150° C. for one to 120 hours, whereby the silica derivative is subjected to polymerization through hydrolysis polycondensation reaction (a preliminary crosslinking process), thereby forming a mesoporous silica thin film while a cyclic self-agglomerate of the surface active agent is taken as a mold.

As shown in FIG. 5A, the self-agglomerate forms a spherical micelle structure (FIG. 5B) into which a plurality of molecules, each comprising $C_{16}H_{33}N^+(CH_3)_3Br^-$, coagulate. There is formed a cylindrical member (FIG. 5E), wherein portions from which methyl groups have been dropped are hollowed (FIG. 5C) as the degree of coagulation is increased as a result of an increase in density and wherein columnar pores are oriented.

The substrate is raised and subjected to rinsing and drying. Subsequently, the substrate is heated and sintered for three hours in an oxygen atmosphere at 400° C., thereby completely removing the surface active agent remaining in a mold through thermal decomposition. A pure mesoporous silica thin film is formed. In this structure, the thin film is understood to be porous and separated into a plurality of domains, and pores are oriented in each domain.

In this way, the thin film 7 of low dielectric constant of the embodiment is formed as shown in FIG. 4B. In fact, in order to form a bit line BL, the low dielectric thin film must be formed twice.

Subsequently, under the ordinary method, contact holes 8 are formed in the thin film 7 of low dielectric constant. After plugs have been formed by embedding a highly-doped polycrystalline silicon layer in the respective contact holes, an iridium oxide layer is formed through use of a gas mixture consisting of argon and oxygen while iridium is used as a target. A platinum layer is formed on the iridium oxide layer while platinum is used as a target. In this way, as shown in FIG. 4C, the iridium oxide layer having a thickness of about 50 nm and the platinum layer having a thickness of about 200 nm are formed. These layers are patterned through photolithography, to thereby form the lower electrodes 9.

The PZT film is formed on the lower electrodes 9 as the ferroelectric film 10 by means of the sol-gel method. A mixed solution of $Pb(CH_3COO)_2 \cdot 3H_2O, Zr(t-OC_4H_9)_4, Ti(i-OC_3H_7)_4$ is used as a starting material. After the mixed solution has been applied over the substrate through spin coating, the substrate is dried at 150° C. and subjected to temporal sintering for 30 minutes at 400° C. in a dry air atmosphere. After having been repeatedly subjected to these operations five times, the substrate is subjected to heat treatment at a temperature of 700° C. or greater in an $O_2$ atmosphere. Thus, the ferroelectric film 10 having a thickness of 250 nm is formed. Here, the PZT film is formed while "x" in $PbZr_xTi_{1-x}O_3$ is taken as 0.52 [hereinafter expressed as PZT (52/48)] (FIG. 4D).

The laminated film 11 consisting of iridium oxide and iridium is formed on the ferroelectric film 10 by means of sputtering. The laminated film consisting of an iridium oxide layer and an iridium layer is taken as an upper electrode 11. The iridium layer and the iridium oxide layer are formed to a total thickness of 200 nm. Thus, a ferroelectric capacitor can be obtained, and the FRAM shown in FIG. 1 is formed.

By means of such a configuration, the interlayer dielectric film is formed from a low dielectric thin film formed from the mesoporous silica thin film. Hence, capacitance attributable to the interlayer dielectric film is diminished, and there can be formed FRAM whose switching characteristic is good and which can operate at high speed.

Since the pores are oriented so as to become parallel with the surface of the substrate, the interlayer dielectric film possesses a uniform, low dielectric constant in the direction perpendicular to the surface of the substrate. Particularly, the interlayer dielectric film can assume a closed structure in which no opening sections are provided for the lower electrode and wiring of the upper layer and the base substrate. The interlayer dielectric film becomes an effective low dielectric thin film which has superior moisture resistance and high reliability. Accordingly, no leakage current arises, and the interlayer dielectric film has longer life.

The composition of the precursor solution is not limited to the composition employed in the embodiment. Under the assumption that the solution assumes a value of 100, the surface active agent preferably assumes a value of 0.01 to 0.1; the silica derivative preferably assumes a value of 0.01 to 0.5; and the acid catalyst preferably assumes a value of 0 to 5. Use of the precursor solution having the composition enables formation of a dielectric film of low dielectric constant having columnar pores.

In the embodiment, cationic cetyltrimethyl ammonium bromide [CATB: $C_{16}H_{33}N^+(CH_3)_3Br^-$] is used as a surface active agent. It goes without saying that the surface active agent is not limited to such an agent and that another surface active agent may be employed.

Use of alkali ions, such as Na ions, as catalysts will deteriorate a semiconductor material. Therefore, use of a cationic surface active agent and use of an acid catalyst are preferable. In addition to HCl, nitric acid ($HNO_3$), sulfuric acid ($H_2SO_4$), phosphoric acid ($H_3PO_4$), $H_4SO_4$, or the like may also be used as the acid catalyst.

The silica derivative is not limited to TMOS. Silicon alkoxide material, such as tetraethoxy silane (TEOS), is preferably used.

Further, the water $H_2O$/alcohol mixed solvent is used as a solvent. However, it may be the case that only water is used.

Moreover, although an oxygen atmosphere is used as a sintering atmosphere, sintering may be performed in the atmosphere, under a reduced pressure, or in a nitrogen atmosphere. Preferably, use of a foaming gas formed from a gas mixture consisting of nitrogen and hydrogen enhances moisture resistance, thereby enabling an attempt to reduce a leakage current.

A mixing ratio of the surface active agent, the silica derivative, the acid catalyst, and the solvent can be changed as required.

The preliminary polymerization process is performed at 30° C. to 150° C. for one through 120 hours. The temperature is desirably set to 60° C. to 120° C., and more preferably to 90° C.

The sintering process is performed for one hour at 400° C. However, sintering may be performed at 300° C. to 500° C. for one to five hours or thereabouts. Preferably, the temperature is set to 350° C. to 450° C.

Sixth Embodiment

A structure in which the pores "h" are oriented in the form of a layer as shown in FIG. 12F is also effective. Here, the structure is formed by further increasing the density of the surface active agent in the precursor solution. In other respects, the processes are the same as those employed in the fifth embodiment.

When the density of the surface active agent in the structure shown in FIG. 4C is increased, molecules are oriented in the form of a layer as shown in FIG. 4D, whereby a dielectric film of low dielectric constant in which the pores "h" are oriented in the form of a layer as shown in FIG. 4F is formed. Such a structure has a percentage of pores higher than that of the structure having columnar pores and hence enables a decrease in dielectric constant.

At the time of formation of the precursor solution, the structure of the resultant structural body is known to change according to the proportion of the surface active agent to the silica derivative.

For instance, when a molecular ratio of the surface active agent to the silica derivative, such as CATB/TEOS, assumes a value of 0.3 to 0.8, a three-dimensional network structure (cubic structure) is known to be obtained. If the molecular ratio is lower than this molecular ratio and assumes a value of 0.1 to 0.5, there is obtained a dielectric film of low dielectric constant in which columnar pores are oriented. In contrast, when the molecular ratio is greater than that molecular ratio and assumes a value of 0.5 to 2, there is obtained a dielectric film of low dielectric constant in which layered pores are oriented.

The embodiment has described the coating method using the spinner. However, a so-called brush painting method for applying a solution with a brush is also applicable.

Seventh Embodiment

A semiconductor device of multilayer wiring structure using the low dielectric thin film as an interlayer dielectric film will be described as a seventh embodiment of the invention.

Figure 13:
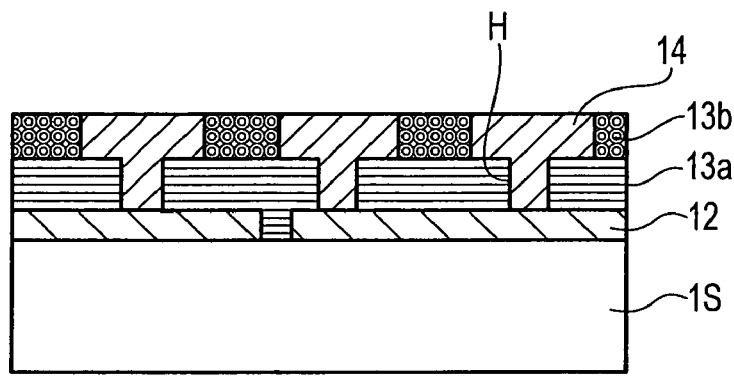
FIG. 13 is a view showing a semiconductor device of multilayer wiring structure using a dielectric film formed by means of a method according to a seventh embodiment of the invention.

As shown in FIGS. 13, 15G, and 15H, the semiconductor device is characterized in that an interlayer dielectric film is formed from an inorganic dielectric film having a porous structure, in which a frame surrounding the pores "h" are coated with a hydrophobic layer S. FIGS. 15G and 15H are enlarged descriptive views showing the porous structure of an interlayer dielectric film employed herein. In this embodiment, the semiconductor device is characterized as follows. Specifically, in order to form a more effective interlayer dielectric film, the interlayer dielectric film is formed from a dielectric film having a two-layer structure and a low dielectric constant. A first interlayer dielectric film 13a having the contact holes H to contact the first wiring layer 12 is formed from a second porous structure domain, wherein the layered pores "h" are arranged cyclically so as to become parallel with the surface of the substrate, and a framework surrounding the pores "h" is coated with the hydrophobic layer S. The second interlayer dielectric film 13b—which is charged in an inter-wiring region of the upper-layer-side second wiring layer 14 formed on the first interlayer dielectric film 13a—is formed from the first porous structure domain in which columnar pores are arranged cyclically, and the framework surrounding the pores "h" is coated with the hydrophobic layer S.

Specifically, a lower layer portion of the interlayer dielectric film—which is formed between the first wiring layer 12 formed on the surface of an element region enclosed with the element isolation dielectric film (not shown) formed on the surface of the silicon substrate 1S and the second wiring layer 14—is taken as the first interlayer dielectric film 13a in which layered pores are arranged cyclically so as to become parallel with the surface of the substrate. The second interlayer dielectric film 13b—which serves as an upper layer side and is formed in a region between wiring patterns of the second wiring layer as an inter-line dielectric film—is formed from a first porous structure domain in which columnar pores are arranged cyclically.

The other portions of the semiconductor device are of ordinary structure, and their illustrations and explanations are omitted.

Processes for manufacturing the interlayer dielectric film will now be described by reference to FIGS. 14A to 14D.

First, as shown in FIG. 14A, a desired semiconductor region is formed on the surface of a silicon substrate 1S by means of an ordinary method, thereby forming the first wiring layer 12.

Subsequently, by means of the method of the invention, a mesoporous silica thin film is formed from a second cyclic porous structure domain, wherein the layered pores are arranged cyclically so as to become parallel with the surface of the substrate, and a framework surrounding the pores is coated with a hydrophobic layer (FIG. 14B).

Specifically, as shown in FIG. 3A, cationic cetyltrimethyl ammonium bromide [CTAB: $C_{16}H_{33}N^+(CH_3)_3Br^-$] serving as a surface active agent; tetramethoxy silane (TMOS) serving as a silica derivative; and hydrochloric acid (HCl) serving as an acid catalyst are dissolved into the $H_2O$/alcohol mixed solvent, thereby preparing a precursor solution with in the mixing container. Mole ratios employed for preparing the precursor solution are determined such that 0.5 parts surface active agent, 1 part silica derivative, and 2 parts acid catalyst are mixed together with the solution being taken as 100 parts. A substrate having the first wiring layer 12 formed thereon is immersed in the mixture of solutions. As shown in FIG. 3B, after the mixing container has been sealed, the mixture is maintained at 30° C. to 150° C. for one to 120 hours, whereby the silica derivative is subjected to polymerization through hydrolysis polycondensation reaction (a preliminary crosslinking process), thereby forming a cyclic self-agglomerate of the surface active agent.

As shown in FIG. 15A, the self-agglomerate forms a spherical micelle structure (FIG. 15B) into which a plurality of molecules, each comprising $C_{16}H_{33}N^+(CH_3)_3Br^-$, coagulate. There is formed a laminated structure (FIG. 15D) in which the surface active agent is oriented as the density increases (FIG. 15C).

The substrate is raised and subjected to rinsing and drying. Subsequently, the substrate is heated and sintered for three hours in an oxygen atmosphere at 400° C., thereby completely removing the surface active agent remaining in the mold through thermal decomposition. A pure mesoporous silica thin film is formed.

Subsequently, the mesoporous silica thin film is exposed to steam of trimethyl-chloro-silane or triethyl-chloro-silane. The thus-exposed thin film is left for 24 hours at 90° C. to 300° C. As shown in FIG. 14B, there is formed the first interlayer dielectric film 13a, wherein the layered pores parallel to the surface of the substrate are arranged, and the framework surrounding the pores is coated with the hydrophobic layer. FIG. 15H shows an enlarged descriptive view of the first interlayer dielectric film. Here, the high-density self-agglomerate such as that shown in FIG. 15D is formed and sintered, whereby an inorganic dielectric film, such as that shown in FIG. 15F, in which layered pores are arranged can be formed. As shown in FIG. 15H, the thus-formed inorganic dielectric film is sililated, thereby forming the interlayer dielectric film 13a whose framework surrounding the pores "h" is coated with the hydrophobic layer S. A reaction formula achieved at this time is as follows:

Si—OH+Si (CH$_3$)$_3$Cl—Si—O—Si(CH$_3$)$_3$+HCl

As shown in FIG. 14C, the through holes H are formed in the first interlayer dielectric film 13a, and the second wiring layer 14 is formed by means of the ordinary method.

Subsequently, the second interlayer dielectric film 13b is formed. The second interlayer dielectric film is formed in the same manner as in the process for forming the first interlayer dielectric film 13a. However, there is employed a precursor solution whose composition is changed from that of the precursor solution employed for forming the first interlayer dielectric film. Here, mole ratios employed for preparing the precursor solution are determined such that 0.05 parts surface active agent, 0.1 parts silica derivative, and 2 parts acid catalyst are mixed together with the solution being taken as 100 parts. In other respects, the second interlayer dielectric film is formed in totally the same manner as that employed for forming the first interlayer dielectric film.

As shown in FIG. 14D, there is obtained the second interlayer dielectric film 13b formed from the first porous structure domain, wherein columnar pores are cyclically arranged and the framework surrounding the pores "h" is coated with the hydrophobic layer S.

Here, the spherical micelle structure into which a plurality of molecules, each comprising $C_{16}H_{33}N^+(CH_3)_3Br^-$, coagulate is further increased in density, thereby forming a cylindrical substance in which pores are oriented. Thus, a self-agglomerate such as that shown in FIG. 15C is formed and sintered. Thus, there is obtained the second interlayer dielectric film 13b formed from the first porous structure domain, such as that shown in FIG. 15E, wherein columnar pores are cyclically arranged. The second interlayer dielectric film is sililated, thereby forming the interlayer dielectric film 13b whose framework surrounding the pores "h" is coated with the hydrophobic layer S, as shown in FIG. 15G.

Figure 16:
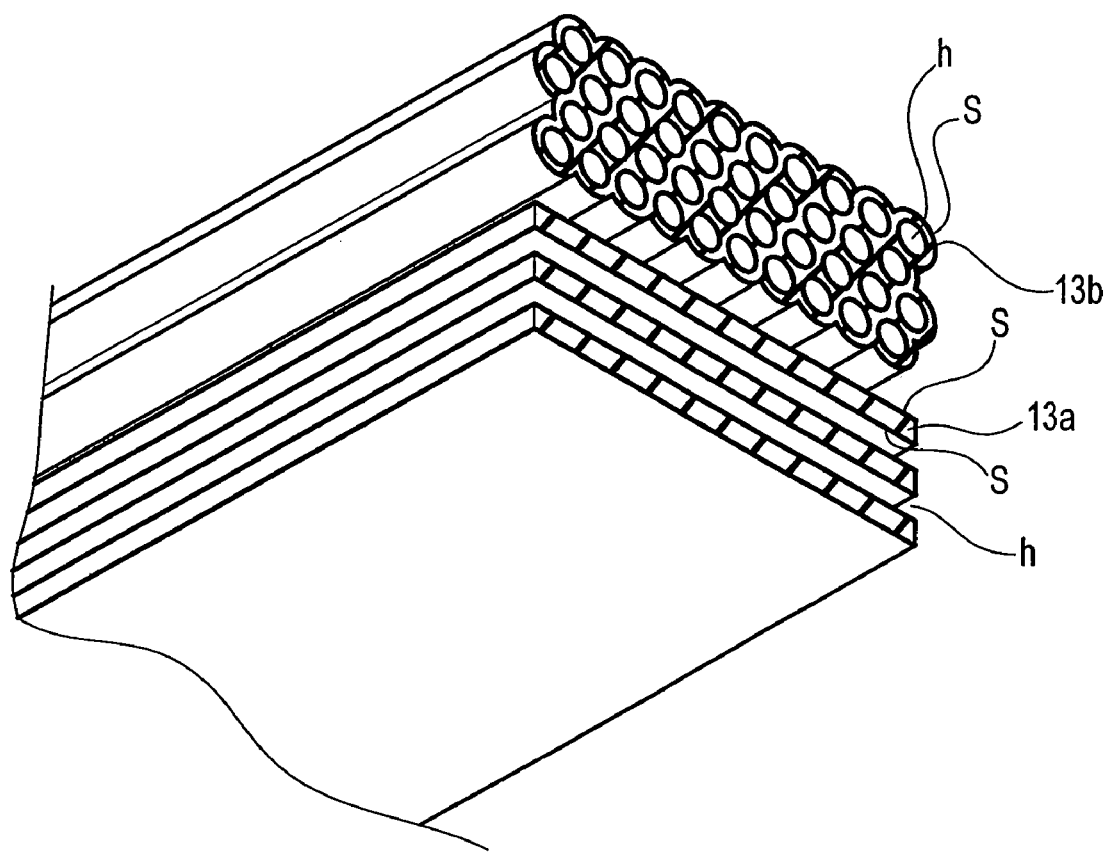
FIG. 16 is a structural descriptive view showing the interlayer dielectric film according to the seventh embodiment of the invention.

FIG. 16 is a structural descriptive view showing a cross section of the substrate in this state. As is evident from the drawing, the multilayer wiring structure is understood to comprise the first interlayer dielectric film 13a formed from a porous thin film, in which the pores are formed in a layered form and the framework surrounding pores "h" is coated with the hydrophobic layer S; and the second interlayer dielectric film 13b, in which columnar pores are cyclically arranged and the framework surrounding the pores "h" is coated with the hydrophobic layer S.

In relation to the semiconductor device having the thus-formed multilayer wiring structure, the first interlayer dielectric film 13a constitutes, in the region surrounding the contact holes H, the second porous structure domain in which the layered pores are arranged cyclically and the framework surrounding the pores "h" is coated with the hydrophobic layer S. Hence, the interlayer capacitance can be diminished. Further, the columnar pores are arranged between wiring patterns within the upper layer wiring region constituting the inter-wiring dielectric film, and hence inter-wiring capacitance is lowered. In the second interlayer dielectric film 13b constituting the inter-wiring dielectric film, the columnar pores are oriented so as to become parallel with the direction in which a wiring pattern of the second wiring layer 14 is arranged, and the framework surrounding the pores "h" is coated with the hydrophobic layer S. Hence, there can be provided a semiconductor device having high reliability without involvement of a problem of occurrence of a short circuit between wiring patterns.

Eighth Embodiment

In the seventh embodiment, the interlayer dielectric film is formed from a dielectric film having a two-layer structure and a low dielectric constant. A lower layer portion of the interlayer dielectric film is formed from the second porous structure domain, in which layered pores are arranged cyclically so as to become parallel with the surface of the substrate, and the framework surrounding the pores is coated with the hydrophobic layer. An upper layer portion of the interlayer dielectric film is formed from the first porous structure domain in which the columnar pores are arranged cyclically and the framework surrounding the pores is coated with the hydrophobic layer. However, the upper layer portion of the interlayer dielectric film may be formed from a third porous structure domain which is perpendicular to the surface of the substrate and runs in parallel with a main wiring pattern, instead of the porous structure domain having the columnar pores.

Figure 17:
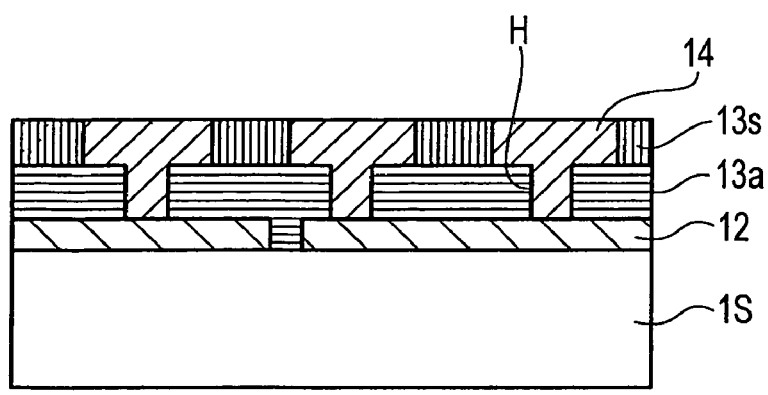
FIG. 17 is a descriptive view showing a semiconductor device according to an eighth embodiment of the invention.

The structure of the third porous structure domain is shown in FIG. 17. As shown in FIG. 17, the semiconductor device is characterized in that the interlayer dielectric film is formed from a low dielectric film of two-layer structure; in that the first interlayer dielectric film 13a having the contact holes H that contact the first wiring layer 11 is formed from the second porous structure domain, in which layered pores are arranged cyclically so as to become parallel with the surface of the substrate, and the framework surrounding the pores is coated with the hydrophobic layer; and in that the second interlayer dielectric film 13S which is to be formed on the first interlayer dielectric film 13a, serves as an upper layer portion, and is charged into the inter-wiring region of the second wiring layer 14 is formed from the third porous structure domain, in which columnar pores are arranged cyclically and the framework surrounding the pores "h" is coated with the hydrophobic layer S.

Specifically, a lower layer portion of the interlayer dielectric film—which is formed between the first wiring layer 12 formed on the surface of an element region enclosed with the element isolation dielectric film (not shown) formed on the surface of the silicon substrate 11 and the second wiring layer 14—is taken as the first interlayer dielectric film 13a in which layered pores are arranged cyclically so as to become parallel with the surface of the substrate. The second interlayer dielectric film 13S—which serves as an upper layer portion and is formed in a region between wiring patterns of the second wiring layer as an inter-line dielectric film—is formed from the third porous structure domain which is perpendicular to the surface of the substrate and runs in parallel with the main wiring pattern.

The other portions of the semiconductor device are formed in totally the same manner as in the case of the first embodiment, and their illustrations and explanations are omitted.

By means of such a configuration, the inter-wiring capacitance can be lowered further. Since the third porous structure domain runs in parallel with the main wiring pattern, a multilayer insulation wall is present between wiring patterns, whereby occurrence of a short circuit between wiring patterns can be prevented more reliably.

Ninth Embodiment

FRAM using a low dielectric thin film as an interlayer dielectric film is described as a ninth embodiment of the invention.

As shown in FIG. 18A, the FRAM comprises a switching transistor fabricated in the element region enclosed with the element isolation dielectric film 2 formed on the surface of the silicon substrate 1, and a ferroelectric capacitor. The invention is characterized by use of the thin film 7 of low dielectric constant of the invention as an interlayer dielectric film between the switching transistor and the lower electrode 9 of the ferroelectric capacitor. As shown in an enlarged perspective view of the featured section shown in FIG. 18B, the low dielectric thin film is characterized by repeated stacking, perpendicular to the surface of the substrate, the first porous structure domain 7c, in which columnar pores are arranged cyclically and the framework surrounding the pores "h" is coated with the hydrophobic layer S; and the second porous structure domain 7s, in which layered pores are cyclically arranged in parallel with the surface of the substrate and the framework surrounding the pores "h" is coated with the hydrophobic layer S.

By means of such a configuration, particularly when the low dielectric thin film is used as an interlayer dielectric film, the dielectric film can assume a closed structure in which no opening sections are provided for an upper layer wiring pattern or a lower layer wiring pattern. Thus, the interlayer dielectric film plays the role of a low dielectric thin film which has superior moisture resistance and extremely high reliability.

The other portions of the interlayer dielectric film are formed by the ordinary method. The switching transistor has a gate electrode formed on the surface of the silicon substrate 1 by way of the gate dielectric film 3, and a source region 5 and a drain region 6 formed such that the gate electrode is sandwiched therebetween. The lower electrode 9 is connected to the drain region 6 by way of a contact 8. The source region 5 is connected to a bit line BL.

The ferroelectric capacitor is formed from the ferroelectric thin film 10 which is formed from a PZT between the lower electrode 9 and the upper electrode 11.

Processes for manufacturing the FRAM will be described by reference to FIGS. 8A to 8D described in connection with the third embodiment.

First, under the ordinary method, the gate electrode 4 is formed on the surface of the silicon substrate 1 by way of the gate dielectric film 3. The substrate is subjected to diffusion of impurities while the gate electrode is taken as a mask, thereby forming the source region 5 and the drain region 6 (FIG. 8A).

Subsequently, under the method of the invention, a mesoporous silica thin film is formed to include a plurality of cyclic porous structure domains containing columnar pores oriented in one direction so as to become parallel with the surface of the substrate (FIG. 8B).

Specifically, as shown in FIG. 3A, cationic cetyltrimethyl ammonium bromide [CTAB: $C_{16}H_{33}N^+(CH_3)_3Br^-$] serving as a surface active agent; tetramethoxy silane (TMOS) serving as a silica derivative; and hydrochloric acid (HCl) serving as an acid catalyst are dissolved into an $H_2O$/alcohol mixed solvent, thereby preparing a precursor solution within a mixing container. Mole ratios employed for preparing the first precursor solution are determined such that 0.05 parts surface active agent, 0.1 parts silica derivative, and 2 parts acid catalyst are mixed together with the solution being taken as 100 parts. Mole ratios employed for preparing the second precursor solution are determined such that 0.5 parts surface active agent, 1 part silica derivative, and 2 parts acid catalyst are mixed together with the solution being taken as 100 parts. As shown in FIG. 9, the thus-formed first and second precursor solutions are dropped onto the surface of the substrate 1 placed on a spinner by way of respective nozzles. The substrate is spun at 500 to 5000 rpm, to thus form a mesoporous silica thin-film. The mesoporous silica thin film is maintained at a temperature of 30° C. to 150° C. for one to 120 hours, whereby the silica derivative is subjected to polymerization through hydrolysis polycondensation reaction (a preliminary crosslinking process), thereby forming a mesoporous silica thin film while a cyclic self-agglomerate of the surface active agent is taken as a mold. Here, the preliminary crosslinking process is performed preferably at 60° C. to 120° C., more preferably at 70° C. to 90° C., for about 12 to 72 hours.

As in the case of the seventh embodiment, the substrate is sintered to completely thermally decompose and remove the surface active agent, thus forming a pure mesoporous silica thin film. Finally, the mesoporous silica thin film is exposed to steam of trimethyl-chloro-silane or triethyl-chloro-silane. The thus-exposed thin film is left for a few minutes to several days at 90° C. to 300° C., thereby coating the framework surrounding the pores "h" with the hydrophobic layer S.

In this way, as shown in FIG. 8B, the thin film 7 of low dielectric constant of the embodiment is formed. In fact, in order to form the bit line BL, the low dielectric thin film must be formed twice. An interlayer dielectric film of two-layer structure having different layouts of pores may be formed by use of precursor solutions of different composition ratios before and after formation of the bit line BL.

In the embodiment, the substrate is subjected to preliminary crosslinking after the precursor solution has been applied over the surface of the substrate. However, the precursor solution may be applied over the surface of the substrate after the substrate has been subjected to crosslinking. By means of such a configuration, the precursor solutions hardly become mixed together and can maintain their own states. For this reason, an interlayer dielectric film having a plurality of cyclic porous structures can be formed more easily.

Subsequently, by means of the ordinary method, contact holes 8 are formed in the thin film 7 of low dielectric constant. After plugs have been formed by embedding a highly-doped polycrystalline silicon layer in the respective contact holes, an iridium oxide layer is formed through use of a gas mixture consisting of argon and oxygen while iridium is used as a target. A platinum layer is formed on the iridium oxide layer while platinum is used as a target. In this way, as shown in FIG. 8C, the iridium oxide layer having a thickness of about 50 nm and the platinum layer having a thickness of about 200 nm are formed. These layers are patterned through photolithography, to thereby form the lower electrodes 9.

A PZT film is formed on the lower electrodes 9 as the ferroelectric film 10 by means of the sol-gel method. A mixed solution of $Pb(CH_3COO)_2.3H_2O, Zr(t-OC_4H_9)_4, Ti(i-OC_3H_7)_4$ is used as a starting material. After the mixed solution has been applied over the substrate through spin coating, the substrate is dried at 150° C. and subjected to temporal sintering for 30 minutes at 400° C. in a dry air atmosphere. After having been repeatedly subjected to these operations five times, the substrate is subjected to heat treatment at a temperature of 700° C. or greater in an $O_2$ atmosphere. Thus, the ferroelectric film 10 having a thickness of 250 nm is formed. Here, the PZT film is formed while "x" in $PbZr_xTi_{1-x}O_3$ is taken as 0.52 [hereinafter expressed as PZT (52/48)] (FIG. 8D).

Figure 18:
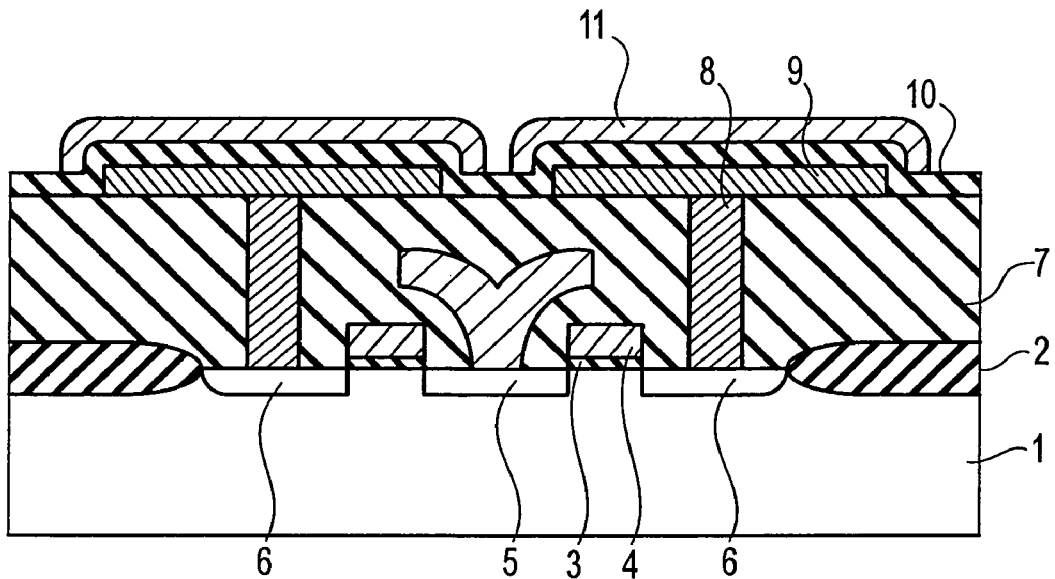
FIGS. 18(a)-18(b) are views showing FRAM using a dielectric film formed by means of a method according to a ninth embodiment of the invention.
Figure 18:
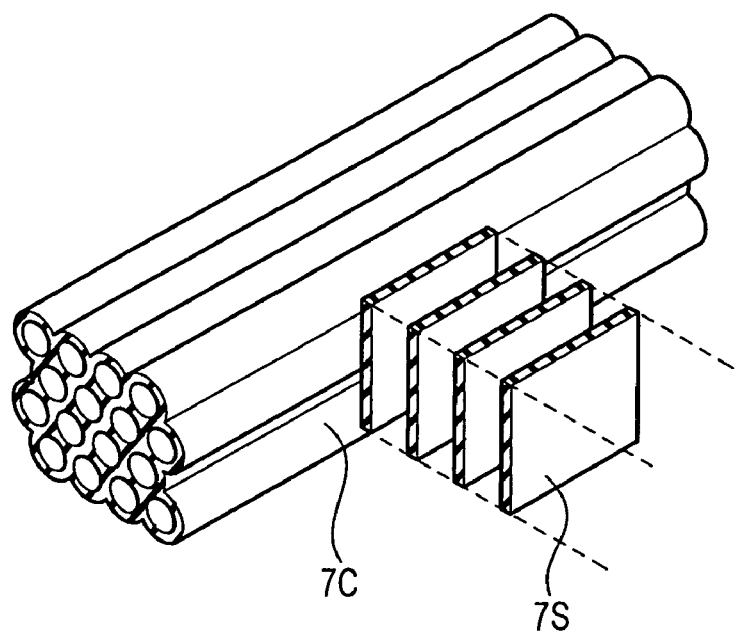

A laminated film 11 consisting of iridium oxide and iridium is formed on the ferroelectric film 10 by means of sputtering. The laminated film consisting of an iridium oxide layer and an iridium layer is taken as an upper electrode 11. The iridium layer and the iridium oxide layer are formed to a total thickness of 200 nm. Thus, a ferroelectric capacitor can be obtained, and the FRAM shown in FIG. 18 is formed.

By means of such a configuration, the interlayer dielectric film is formed from a low dielectric thin film formed from the mesoporous silica thin film. Hence, capacitance attributable to the interlayer dielectric film is diminished, and there can be formed FRAM whose switching characteristic is good and which can operate at high speed.

By virtue of a cyclic porous structure, the mechanical strength of the dielectric film can be enhanced, and the dielectric film having high reliability can be obtained.

Since the framework surrounding the pores is coated with the hydrophobic layer, a structure having higher moisture resistance can be obtained. Moreover, the first porous structure domain having columnar pores cyclically arranged therein and the second porous structure domain having layered pores cyclically arranged on the surface of the substrate in a vertical direction are arranged repeatedly. The pores can assume a closed structure in which no opening sections are provided for the upper and lower wiring. The interlayer dielectric film plays the role of a low dielectric thin film which has superior moisture resistance and high reliability. Accordingly, no leakage current arises, and the interlayer dielectric film has longer life.

The composition of the first precursor solution is not limited to the composition employed in the embodiment. Under the assumption that the solution assumes a value of 100, the surface active agent preferably assumes a value of 0.01 to 0.1; the silica derivative preferably assumes a value of 0.01 to 0.5; and the acid catalyst preferably assumes a value of 0 to 5. Use of the precursor solution having the composition enables formation of a dielectric film of low dielectric constant having columnar pores.

The composition of the second precursor solution is not limited to that employed in the embodiment. Under the assumption that the solution assumes a value of 100, the surface active agent preferably assumes a value of 0.1 to 10; the silica derivative preferably assumes a value of 0.5 to 10; and the acid catalyst preferably assumes a value of 0 to 5. Use of the precursor solution having the composition enables formation of a dielectric film of low dielectric constant having layered pores.

In the embodiment, cationic cetyltrimethyl ammonium bromide [CTAB: $C_{16}H_{33}N^+(CH_3)_3Br^-$] is used as a surface active agent. It goes without saying that the surface active agent is not limited to such an agent, and another surface active agent may be employed.

Use of alkali ions, such as Na ions, as catalysts will deteriorate a semiconductor material. Therefore, use of a cationic surface active agent and use of an acid catalyst are preferable. In addition to HCl, nitric acid ($HNO_3$), sulfuric acid ($H_2SO_4$), phosphoric acid ($H_3PO_4$), $H_4SO_4$, or the like may also be used as the acid catalyst.

The silica derivative is not limited to TMOS. Silicon alkoxide material, such as tetraethoxy silane (TEOS), is preferably used.

Further, the water $H_2O$/alcohol mixed solvent is used as a solvent. However, it may be the case that only water is used.

Moreover, although a nitrogen atmosphere is used as a sintering atmosphere, sintering may be performed under a reduced pressure or in the atmosphere. Preferably, addition of sintering involving usage of a foaming gas formed from a gas mixture consisting of nitrogen and hydrogen enhances moisture resistance, thereby enabling an attempt to reduce a leakage current.

A mixing ratio of the surface active agent, the silica derivative, the acid catalyst, and the solvent can be changed as required.

The preliminary polymerization process is held at 30° C. to 150° C. for one through 120 hours. The temperature is desirably set to 60° C. to 120° C., more preferably to 90° C.

The sintering process is performed for one hour at 400° C. However, sintering may be performed at 300° C. to 500° C. for one to five hours or thereabouts. Preferably, the temperature is set to 350° C. to 450° C.

The sililation process is performed by exposing the mesoporous silica thin film to a steam of sililation agent. However, needless to say, a solution or mist may also be employed.

Tenth Embodiment

In the ninth embodiment, the mesoporous silica thin film is formed by immersing the substrate into the precursor solution. However, formation of the mesoporous silica thin film is not limited to immersion. As shown in FIG. 10, a dip coating method may also be employed.

Specifically, the substrate is lowered to a liquid level of the prepared precursor solution at right angles at a speed of 1 mm/s through 10 m/s until it sinks in the solution, and is left stationary for one second to one hour.

After lapse of a desired period of time, the substrate is raised at right angles and at a rate of 1 mm/s through 10 m/s until being taken out of the solution.

As in the case of the ninth embodiment, the substrate is subjected to sintering, to thereby completely thermally decompose and remove the surface active agent and produce a pure mesoporous silica thin film. Finally, the substrate is subjected to sililation, to thereby form a mesoporous silica thin film whose framework surrounding the pores "h" is coated with the hydrophobic layer S.

When CATB is used as the surface active agent and TEOS is used as the silica derivative, the structure of the resultant structural body is known to change according to a proportion of the surface active agent to the silica derivative.

For instance, when a molecular ratio of the surface active agent to the silica derivative, such as CATB/TEOS, assumes a value of 0.3 to 0.8, a network structure (cubic structure) is known to be obtained. If the molecular ratio is lower than this molecular ratio and assumes a value of 0.1 to 0.5, there is obtained a dielectric film of low dielectric constant in which columnar pores are oriented. In contrast, when the molecular ratio is greater than that molecular ratio and assumes a value of 0.5 to 2, there is obtained a dielectric film of low dielectric constant in which layered pores are oriented.

The embodiment has described the interlayer dielectric film of FRAM. However, the invention can also be applied to various semiconductor devices using silicon; a high-speed device including a device, such as HEMT, which uses a compound semiconductor; a high-frequency device such as a microwave IC; highly-integrated ferroelectric memory of MFMIS type; and a microwave transmission line or multilayer wiring board using a film carrier or the like.

As has been described, according to the invention, there is constituted an inorganic dielectric film of porous structure whose framework surrounding the pores "h" is coated with a hydrophobic layer. Hence, a dielectric film which is easily controllable and has high mechanical strength and a low dielectric constant can be obtained.

Particularly, an effective low dielectric thin film can be obtained as an interlayer dielectric film.

Eleventh Embodiment

FRAM using a low dielectric thin film as an interlayer dielectric film is described as an eleventh embodiment of the invention.

As shown in FIGS. 19A and 19B, the FRAM comprises a switching transistor fabricated in the element region enclosed with the element isolation dielectric film 2 formed on the surface of the silicon substrate 1, and the ferroelectric capacitor. The invention is characterized by use of the thin film 7 of low dielectric constant of the invention as an interlayer dielectric film between the switching transistor and the lower electrode 9 of the ferroelectric capacitor. As shown in an enlarged perspective view of the featured section shown in FIG. 19B, the low dielectric thin film is formed from a mesoporous silica thin film formed so as to assume a porous structure which is formed on the surface of the substrate and has the pores "h," each having a three-dimensional network structure.

The other portions of the interlayer dielectric film are formed by means of the ordinary method. The switching transistor has the gate electrode 4 formed on the surface of the silicon substrate 1 by way of the gate dielectric film 3, and the source region 5 and the drain region 6 formed such that the gate electrode 4 is sandwiched therebetween. The lower electrode 9 is connected to the drain region 6 by way of the contact 8. Source and drain regions are connected to a bit line BL.

The ferroelectric capacitor is formed from a ferroelectric thin film 10 which is formed from a PZT between the lower electrode 9 and the upper electrode 11.

Processes for manufacturing the FRAM will be described by reference to the drawings shown in FIGS. 8A to 8D.

First, by means of the ordinary method, the gate electrode 4 is formed on the surface of the silicon substrate 1 by way of the gate dielectric film 3. The substrate is subjected to diffusion of impurities while the gate electrode 4 is taken as a mask, thereby forming the source region 5 and the drain region 6 (FIG. 8A).

Subsequently, under the method of the invention, a mesoporous silica thin film is formed to include the porous structure having the pores, each having a three-dimensional network structure (FIG. 8B).

Specifically, as shown in FIG. 2A, cationic cetyltrimethyl ammonium bromide [CTAB: $C_{16}H_{33}N^+(CH_3)_3Br^-$] serving as a surface active agent; tetramethoxy silane (TMOS) serving as a silica derivative; and hydrochloric acid (HCl) serving as an acid catalyst are dissolved into an $H_2O$/alcohol mixed solvent, thereby preparing a precursor solution within a mixing container. Mole ratios employed for preparing the precursor solution were determined such that 0.02 parts surface active agent, 0.4 parts silica derivative, and 2 parts acid catalyst are mixed together with the solution being taken as 100 parts. As shown in FIG. 2B, after the mixing container has been sealed, the mesoporous silica thin film is maintained at 30° C. to 150° C. for one to 120 hours, whereby the silica derivative is subjected to polymerization through hydrolysis polycondensation reaction (a preliminary crosslinking process), thereby forming a mesoporous silica thin film while a cyclic self-agglomerate of the surface active agent is taken as a mold.

As shown in FIG. 4A, the self-agglomerate forms a spherical micelle structure (FIG. 4B) into which a plurality of molecules, each comprising $C_{16}H_{33}N^+(CH_3)_3Br^-$, coagulate. There is formed a cylindrical member (FIG. 4E), wherein the surface active agent is oriented as the density increases (FIG. 4C). The cylindrical member is further transformed into a three-dimensional network cylindrical member through a phase change.

The substrate is raised and subjected to rinsing and drying. Subsequently, the substrate is heated and sintered for three hours in an oxygen atmosphere at 400° C., thereby completely removing the surface active agent remaining in the mold through thermal decomposition. A pure mesoporous silica thin film having a three-dimensional network is formed. Consideration must be paid to the sintering atmosphere.

In this way, the thin film 7 of low dielectric constant of the embodiment is formed as shown in FIG. 8B. In fact, in order to form a bit line BL, the low dielectric thin film must be formed twice.

Subsequently, by means of the ordinary method, contact holes 8 are formed in the thin film 7 of low dielectric constant. After plugs have been formed by embedding a highly-doped polycrystalline silicon layer in the respective contact holes, an iridium oxide layer is formed through use of a gas mixture consisting of argon and oxygen while iridium is used as a target. A platinum layer is formed on the iridium oxide layer while platinum is used as a target. In this way, as shown in FIG. 8C, the iridium oxide layer having a thickness of about 50 nm and the platinum layer having a thickness of about 200 nm are formed. These layers are patterned through photolithography, to thereby form the lower electrodes 9.

The PZT film is formed on the lower electrodes 9 as the ferroelectric film 10 by means of the sol-gel method. A mixed solution of $Pb(CH_3COO)_2 \cdot 3H_2O, Zr(t-OC_4H_9)_4, Ti(i-OC_3H_7)_4$ is used as a starting material. After the mixed solution has been applied over the substrate through spin coating, the substrate is dried at 150° C. and subjected to temporal sintering for 30 minutes at 400° C. in a dry air atmosphere. After having been repeatedly subjected to these operations five times, the substrate is subjected to heat treatment at a temperature of 700° C. or greater in an $O_2$ atmosphere. Thus, the ferroelectric film 10 having a thickness of 250 nm is formed. Here, the PZT film is formed while "x" in $PbZr_xTi_{1-x}O_3$ is taken as 0.52 [hereinafter expressed as PZT (52/48)] (FIG. 8D).

Figure 19:
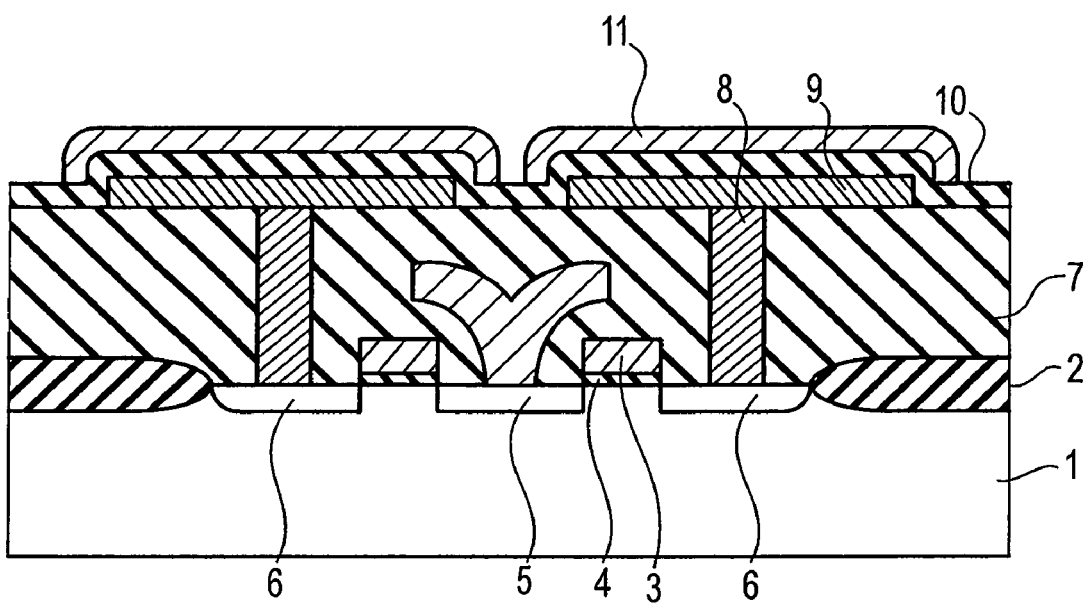
FIGS. 19(a)-19(c) are views showing FRAM using a dielectric film formed by means of a method according to an eleventh embodiment of the invention.
Figure 19:
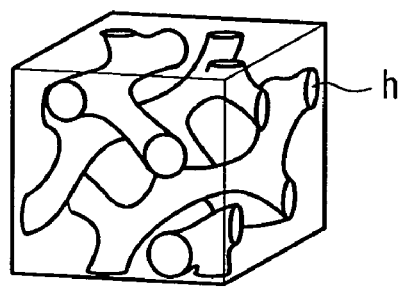
Figure 19:
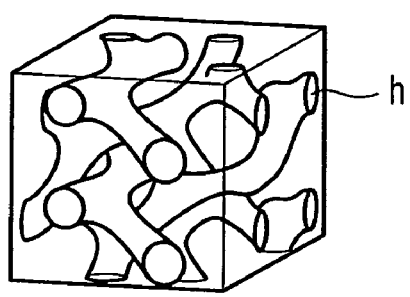

The laminated film 11 consisting of iridium oxide and iridium is formed on the ferroelectric film 10 by means of sputtering. The laminated film consisting of an iridium oxide layer and an iridium layer is taken as an upper electrode 11. The iridium layer and the iridium oxide layer are formed to a total thickness of 200 nm. Thus, a ferroelectric capacitor can be obtained, and the FRAM shown in FIG. 19 is formed.

By means of such a configuration, the interlayer dielectric film is formed from a low dielectric thin film formed from the mesoporous silica thin film that has a three-dimensional network structure. Hence, capacitance attributable to the interlayer dielectric film is diminished, and there can be formed FRAM whose switching characteristic is good and which can operate at high speed.

Since the pores are formed on the surface of the substrate so as to assume a three-dimensional network structure, a uniform, low dielectric constant is achieved over the entire surface of the substrate. Particularly, the interlayer dielectric film can assume a closed structure in which no opening sections are provided for the lower electrode and wiring of the upper layer and the base substrate. The interlayer dielectric film becomes an effective low dielectric thin film which has superior moisture resistance and high reliability. Accordingly, no leakage current arises, and the interlayer dielectric film has longer life.

The composition of the precursor solution is not limited to the composition employed in the embodiment. Under the assumption that the solution assumes a value of 100, the surface active agent preferably assumes a value of 0.05 to 0.5; the silica derivative preferably assumes a value of 0.1 to 1; and the acid catalyst preferably assumes a value of 0 to 5. Use of the precursor solution having the composition enables formation of a dielectric film of low dielectric constant having pores of three-dimensional network structure.

When CATB is used as a surface active agent and TEOS is used as a silica derivative, the structure of the resultant structural body is known to change according to a proportion of the surface active agent to the silica derivative.

For instance, when a molecular ratio of the surface active agent to the silica derivative, such as CATB/TEOS, assumes a value of 0.3 to 0.8, a network structure (cubic structure) is known to be obtained. If the molecular ratio is lower than this molecular ratio, there is obtained a dielectric film of low dielectric constant in which columnar pores are oriented. In contrast, when the molecular ratio is greater than that molecular ratio, there is obtained a dielectric film of low dielectric constant in which layered pores are oriented.

In the embodiment, cationic cetyltrimethyl ammonium bromide [CTAB: $C_{16}H_{33}N^+(CH_3)_3Br^-$] is used as a surface active agent. It goes without saying that the surface active agent is not limited to such an agent, and another surface active agent may be employed.

Use of alkali ions, such as Na ions, as catalysts will deteriorate a semiconductor material. Therefore, use of a cationic surface active agent and use of an acid catalyst are preferable. In addition to HCl, nitric acid ($HNO_3$), sulfuric acid ($H_2SO_4$), phosphoric acid ($H_3PO_4$), $H_4SO_4$, or the like may also be used as the acid catalyst.

The silica derivative is not limited to TMOS. Silicon alkoxide material, such as tetraethoxy silane (TEOS), is preferably used.

Further, the water $H_2O$/alcohol mixed solvent is used as a solvent. However, it may be the case that only water is used.

Moreover, although an oxygen atmosphere is used as a sintering atmosphere, sintering may be performed in the atmosphere, under a reduced pressure, or in a nitrogen atmosphere. Preferably, additional sintering involving usage of a foaming gas formed from a gas mixture consisting of nitrogen and hydrogen enhances moisture resistance, thereby enabling an attempt to reduce a leakage current.

A mixing ratio of the surface active agent, the silica derivative, the acid catalyst, and the solvent can be changed as required.

The preliminary polymerization process is performed at 30° C. to 150° C. for one through 120 hours. The temperature is desirably set to 60° C. to 120° C., more preferably to 90° C.

The sintering process is performed for one hour at 400° C. However, sintering may be performed at 300° C. to 500° C. from one to five hours or thereabouts. Preferably, the temperature is set to 350° C. to 450° C.

As shown in FIG. 1C, so long as there is formed the inorganic dielectric film having the pores "h" of periodic three-dimensional network structure, the dielectric constant can be made more uniform.

Twelfth Embodiment

In the eleventh embodiment, the mesoporous silica thin film is formed by immersing the substrate into the precursor solution. However, formation of the mesoporous silica thin film is not limited to immersion. As shown in FIG. 10, a dip coating method may also be employed.

Specifically, the substrate is lowered to a liquid level of the prepared precursor solution at right angles at a speed of 1 mm/s through 10 m/s until it sinks in the solution, and is left stationary for zero second to one hour.

After lapse of a desired period of time, the substrate is raised at right angles and at a rate of 1 mm/s through 10 m/s until being taken out of the solution.

Finally, as in the case of the first embodiment, the substrate is subjected to sintering, to thereby completely thermally decompose and remove the surface active agent and produce a pure mesoporous silica thin film formed from pores of three-dimensional network structure.

Thirteenth Embodiment

In the first embodiment, the mesoporous silica thin film is formed by immersing the substrate into the precursor solution. However, formation of the mesoporous silica thin film is not limited to immersion. As shown in FIG. 9, a spin coating method may also be employed.

The precursor solution formed in the same manner as in the embodiment is dropped onto the surface of the substrate to be processed placed on the spinner. The substrate is then spun at 500 to 5000 rpm, thus forming a mesoporous silica thin film.

Finally, as in the case of the first embodiment, the substrate is subjected to sintering, to thereby completely thermally decompose and remove the surface active agent and produce a pure mesoporous silica thin film formed from pores of three-dimensional network structure.

By means of such a structure, the porous structure formed from the pores of three-dimensional network structure enhances mechanical strength of the dielectric film, and the dielectric film having high reliability can be obtained. When being used as an interlayer dielectric film, the mesoporous silica thin film assumes a closed structure in which no opening sections are provided for the upper and lower wiring. The interlayer dielectric film plays the role of a low dielectric thin film which has superior moisture resistance and high reliability.

The embodiment has described the coating method using the spinner. However, a so-called brush painting method for applying a solution with a brush is also applicable.

As has been described above, the invention enables easy formation of a porous structure having pores of three-dimensional network structure with superior controllability so that a dielectric film having high mechanical strength and a low dielectric constant can be obtained.

Fourteenth Embodiment

A semiconductor device of multilayer wiring structure using the low dielectric thin film as an interlayer dielectric film will be described as a fourteenth embodiment of the invention.

Figure 20:
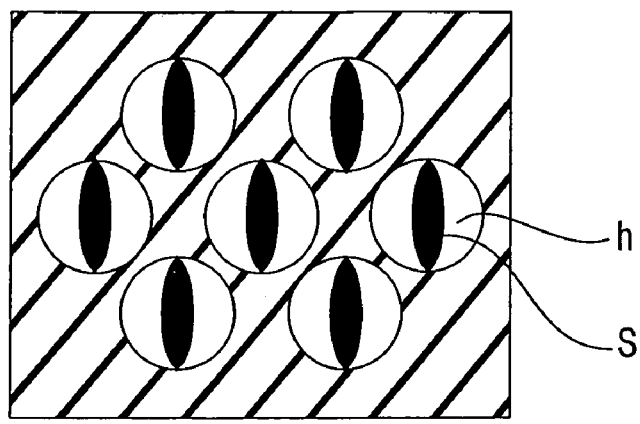
FIGS. 20(a)-20(b) are structural descriptive views of a dielectric film according to a fourteenth embodiment of the invention.
Figure 20:
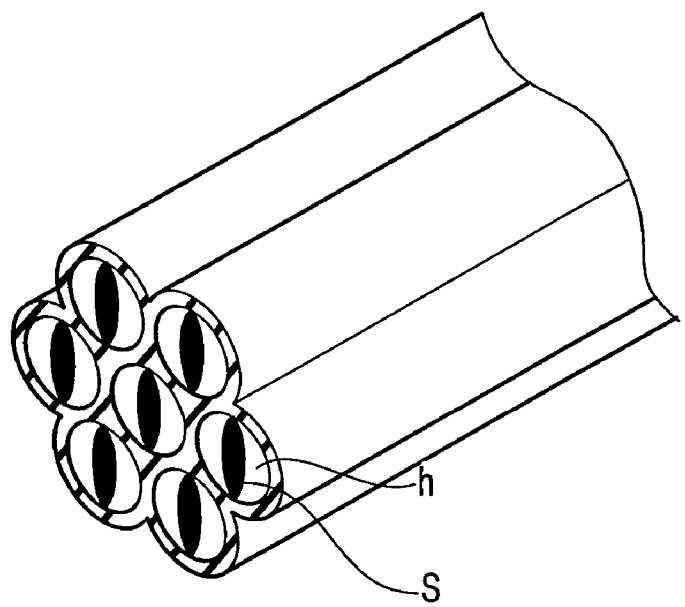

As shown in FIGS. 20A and 20B, the semiconductor device is characterized in that an interlayer dielectric film is formed from a dielectric film of low dielectric constant having a cyclic porous structure which includes poles provided in pores.

Figure 21:
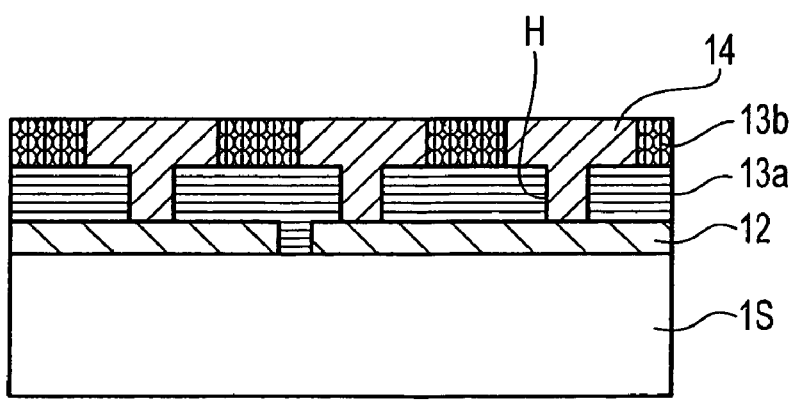
FIG. 21 is a view showing a semiconductor device of multilayer wiring structure using the dielectric film formed by means of the method of the fourteenth embodiment of the invention.

Here, the interlayer dielectric film is formed from a dielectric film of low dielectric constant which has a two-layer structure and includes support members provided in pores as poles. As shown in FIG. 21, the interlayer dielectric film is characterized in that the first interlayer dielectric film 13a having the contact holes H that contact the first wiring layer 12 is formed from the second porous structure domain in which layered pores are arranged cyclically so as to become parallel with the surface of the substrate; and in that the second interlayer dielectric film 13b—which is formed on the first interlayer dielectric film 13a, serves as an upper layer portion, and is charged into areas between wiring patterns of the second wiring layer 14—is formed from the first porous structure domain, in which columnar pores are cyclically arranged in parallel with the surface of the substrate.

Specifically, a lower layer portion of the interlayer dielectric film—which is formed between the first wiring layer 12 formed on the surface of an element region enclosed with the element isolation dielectric film (not shown) formed on the surface of the silicon substrate 11 and the second wiring layer 14—is taken as the first interlayer dielectric film 13a in which layered pores are arranged cyclically so as to become parallel with the surface of the substrate. The second interlayer dielectric film 13b—which serves as an upper layer portion and is formed in regions between wiring patterns of the second wiring layer as an inter-line dielectric film—is formed from the first porous structure domain in which columnar pores are arranged cyclically.

The remaining portions of the semiconductor device are of ordinary structure, and their illustrations and explanations are omitted.

Processes for manufacturing the interlayer dielectric film will now be described by reference to FIGS. 22A to 22D.

Figure 22:
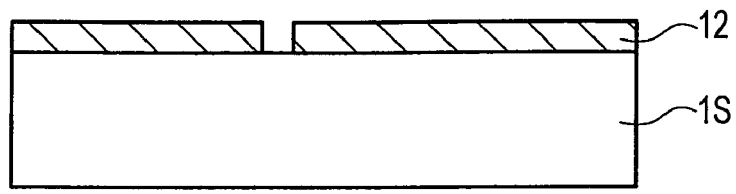
FIGS. 22(a)-22(d) are views showing processes of manufacturing the semiconductor device of multilayer wiring structure shown in FIG. 20.
Figure 22:
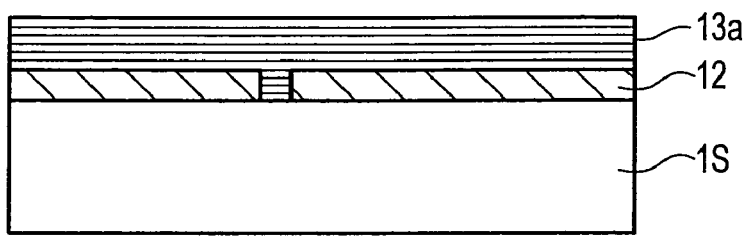
Figure 22:
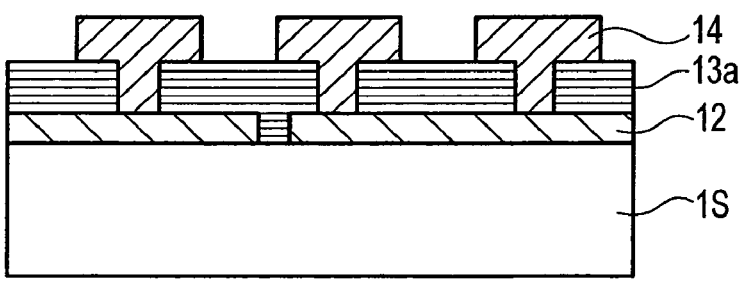
Figure 22:
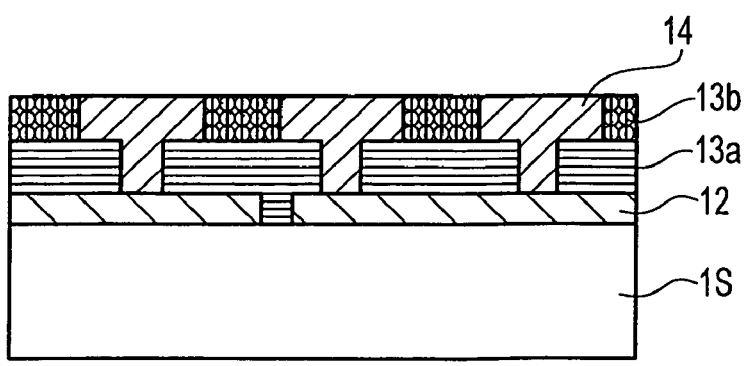

First, as shown in FIG. 22A, a desired semiconductor region is formed on the surface of a silicon substrate 11 by means of an ordinary method, thereby forming the first wiring layer.

Subsequently, by means of the method of the invention, a mesoporous silica thin film is formed from a second cyclic porous structure domain, wherein the layered pores are arranged cyclically so as to become parallel with the surface of the substrate, and a framework surrounding the pores is coated with a hydrophobic layer (FIG. 22B).

Specifically, as shown in FIG. 23A, cationic cetyltrimethyl ammonium bromide [CTAB: $C_{16}H_{33}N^+(CH_3)_3Br^-$] serving as a surface active agent; tetramethoxy silane (TMOS) serving as a silica derivative; and hydrochloric acid (HCl) serving as an acid catalyst are dissolved into the $H_2O$/alcohol mixed solvent, thereby preparing a precursor solution within the mixing container. Mole ratios employed for preparing the precursor solution are determined such that 0.5 parts surface active agent, 5 parts silica derivative, and 2 parts acid catalyst are mixed together with the solution being taken as 100 parts. The substrate having the first wiring layer 12 formed thereon is immersed in the mixture of solutions. As shown in FIG. 3B, after the mixing container has been sealed, the mixture is maintained at 30° C. to 150° C. for one to 120 hours, whereby the silica derivative is subjected to polymerization through hydrolysis polycondensation reaction (a preliminary crosslinking process), thereby forming a mesoporous silica thin film which takes a cyclic self-agglomerate of the surface active agent as a mold.

As shown in FIG. 23A, the self-agglomerate forms a spherical micelle structure (FIG. 23B) into which a plurality of molecules, each comprising $C_{16}H_{33}N^+(CH_3)_3Br^-$, coagulate. There is formed a thin film of laminated structure (FIG. 25A) in which the surface active agent is oriented as the density increases.

Figure 25:
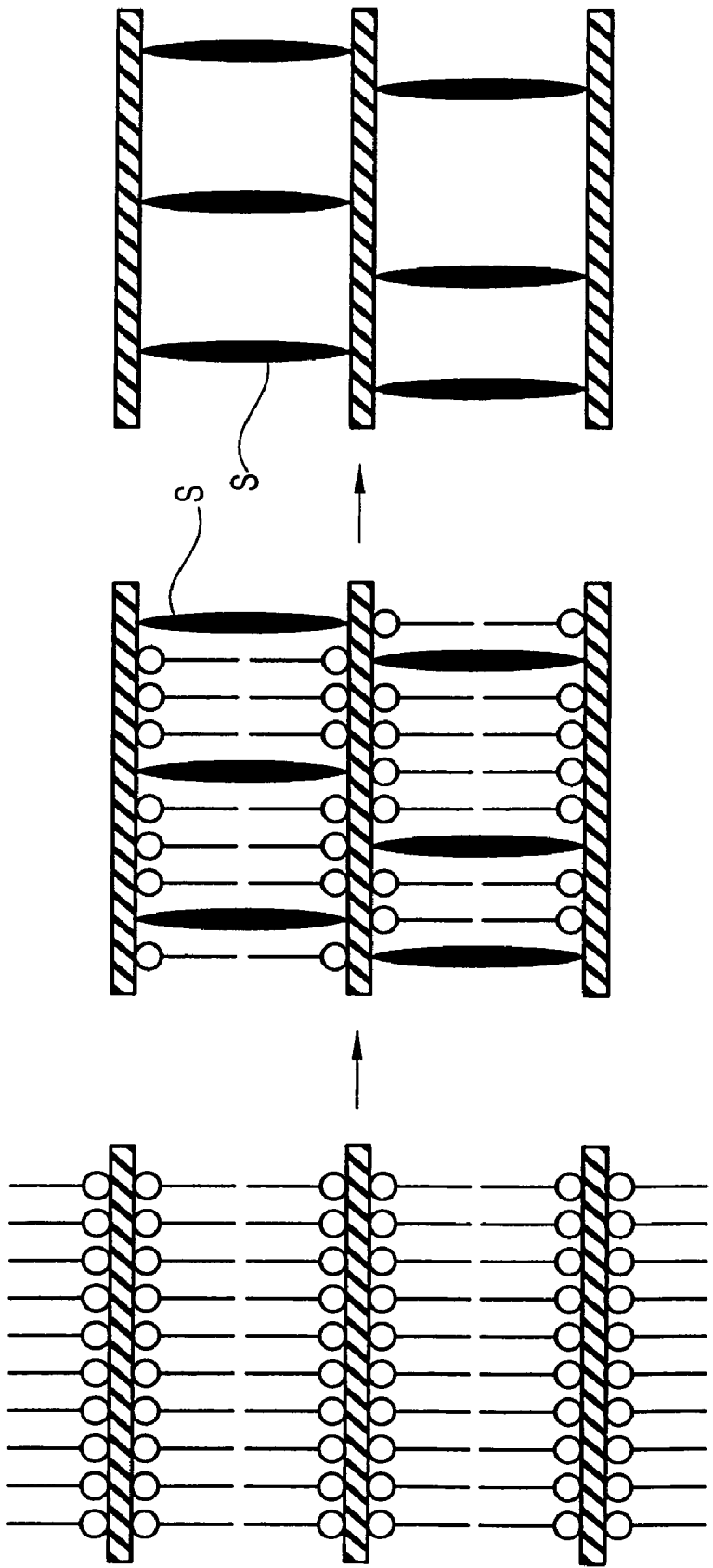
FIGS. 25(a)-25(c) are structural descriptive views showing the interlayer dielectric film of the fourteenth embodiment of the invention.

Subsequently, the substrate is immersed in a magnesium oxide solution at 0 to 90° C. for a few seconds to five hours, whereby portions of the surface active agent are replaced with ultrafine magnesium particles through substitution. As shown in FIG. 25B, the poles S of ultrafine magnesium particles are formed. Here, a desirable temperature is 20 to 30° C. The larger the particles employed for replacement, the slower the particles diffuse. The smaller the particles, the faster the particles diffuse. Hence, the time during which the substrate is to be immersed must be controlled in accordance with particle size. Diffusion has relatively low dependence on temperature, but reaction is highly dependent on temperature.

The substrate is raised and subjected to rinsing and drying. Subsequently, the substrate is heated and sintered for three hours in a nitrogen atmosphere at 400° C., thereby completely removing the surface active agent remaining in the mold through thermal decomposition. As shown in FIG. 25C, a pure mesoporous silica thin film having the poles S is formed. Here, the geometry of the poles can be changed as required; for instance, flat ultrafine particles or normal chain clusters can be produced.

In this way, as shown in FIG. 22B, the first interlayer dielectric film 13a is formed.

As shown in FIG. 22C, the through holes H are formed in the first interlayer dielectric film 13a. By means of the normal method, the second wiring layer 14 is formed.

Subsequently, the second interlayer dielectric film 13b is formed. The second interlayer dielectric film is formed in the same manner as in the process for forming the first interlayer dielectric film 13a. However, there is employed a precursor solution whose composition is changed from that of the precursor solution employed for forming the first interlayer dielectric film. Here, mole ratios employed for preparing the precursor solution were determined such that 0.05 parts surface active agent, 0.1 parts silica derivative, and 2 parts acid catalyst are mixed together with the solution being taken as 100 parts. In other respects, the second interlayer dielectric film is formed in totally the same manner as that employed for forming the first interlayer dielectric film.

As shown in FIG. 22D, there is obtained the second interlayer dielectric film 13b formed from the first porous structure domain, wherein columnar pores are cyclically arranged.

Here, as shown in FIG. 23A, the self-agglomerate forms a spherical micelle structure (FIG. 23B) into which a plurality of molecules, each comprising $C_{16}H_{33}N^+(CH_3)_3Br^-$, coagulate. There is formed a porous member (FIG. 23C) in which the surface active agent is oriented as the density increases. Portions of molecules of the surface active agent are replaced with metal oxide precursors (containing Si and Ge) through substitution, thereby forming the poles S. As a result of the micelle structure having been sintered, there is formed an interlayer dielectric film in which pores having the poles S are arranged, as shown in FIG. 23E. Here, the poles (i.e., supports formed from columnar members) are not necessarily oriented.

The micelle structure, as shown in FIGS. 23D and 23F, is effective and higher in mechanical strength than a structure in which two poles are formed in one pore and sintered.

Figure 24:
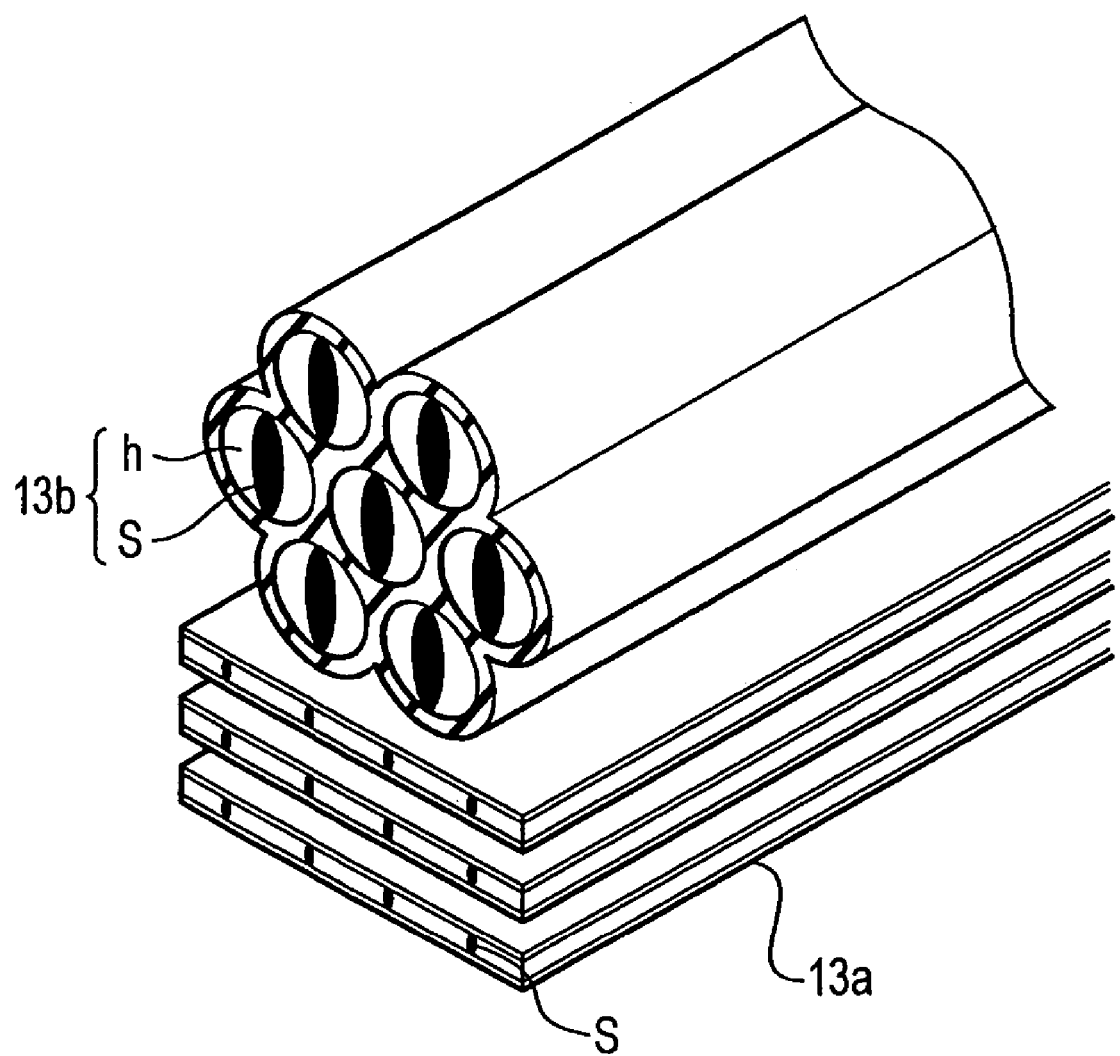
FIG. 24 is a structural descriptive view showing the interlayer dielectric film of the fourteenth embodiment of the invention.

FIG. 24 is a structural descriptive view showing the cross section of the structure in this state. As is evident from the drawing, the structure is understood to comprise the first interlayer dielectric film 13a in which pores are formed in a layered form and which is formed from a porous thin film having poles provided in pores, and the second interlayer dielectric film 13b in which columnar pores are cyclically arranged and which has poles provided in pores.

In relation to the semiconductor device having the thus-formed multilayer wiring structure, the interlayer dielectric film has a two-layer structure formed from the first interlayer dielectric film and the second interlayer dielectric film. The first interlayer dielectric film constitutes, in the region surrounding the contact holes H, the second porous structure domain in which the layered pores are arranged cyclically. Hence, the interlayer capacitance can be diminished. Further, the columnar pores are arranged laterally in an upper-layer wiring region constituting an inter-line dielectric film. Hence, lateral capacitance is lowered to a much greater extent. In the second interlayer dielectric film, the direction in which the columnar pores are arranged is parallel with the wiring direction of the second wiring layer 14. Hence, a highly-reliable semiconductor device can be provided without involvement of occurrence of a short circuit between wires.

Fifteenth Embodiment

FRAM using a low dielectric thin film as an interlayer dielectric film is described as a fifteenth embodiment of the invention.

As shown in FIG. 26A, the FRAM comprises a switching transistor fabricated in the element region enclosed with the element isolation dielectric film 2 formed on the surface of the silicon substrate 1, and the ferroelectric capacitor. The invention is characterized by use of the thin film 7 of low dielectric constant of the invention as an interlayer dielectric film between the switching transistor and the lower electrode 9 of the ferroelectric capacitor. As shown in an enlarged perspective view of the featured section shown in FIG. 26B, the low dielectric thin film is characterized by comprising the first porous structure domain 7c which has supports S and in which columnar pores are arranged cyclically, and the second porous structure domain 7s which has the supports S in the direction differing from that of the first porous structure domain 7C and in which columnar pores are cyclically arranged in parallel with the surface of the substrate, which are repeatedly laminated on the surface of the substrate.

By means of such a configuration, the mechanical strength can be improved to a great extent. The pores can assume a closed structure in which no opening sections are provided for an upper layer wiring pattern or a lower layer wiring pattern. Thus, the interlayer dielectric film plays the role of a low dielectric thin film which has superior moisture resistance and extremely high reliability.

The other portions of the interlayer dielectric film are formed by means of the ordinary method. The switching transistor has a gate electrode formed on the surface of the silicon substrate 1 by way of the gate dielectric film 3, and the source region 5 and the drain region 6 formed such that the gate electrode is sandwiched therebetween. The lower electrode 9 is connected to the drain region 6 by way of the contact 8. Source and drain regions are connected to a bit line BL.

The ferroelectric capacitor is formed from a ferroelectric thin film 10 which is formed from a PZT between the lower electrode 9 and the upper electrode 11.

Processes for manufacturing the FRAM will be described by reference to FIGS. 8A to 8D that have been described in connection with the third embodiment.

First, by means of the ordinary method, the gate electrode 4 is formed on the surface of the silicon substrate 1 by way of the gate dielectric film 3. The substrate is subjected to diffusion of impurities while the gate electrode is taken as a mask, thereby forming the source region 5 and the drain region 6 (FIG. 8A).

Subsequently, by means of the method of the invention, a mesoporous silica thin film is formed to include a plurality of cyclic porous structure domains containing columnar pores oriented in one direction so as to become parallel with the surface of the substrate (FIG. 8B).

Specifically, as shown in FIG. 8A, cationic cetyltrimethyl ammonium bromide [CTAB: $C_{16}H_{33}N^+(CH_3)_3Br^-$] serving as a surface active agent; tetramethoxy silane (TMOS) serving as a silica derivative; and hydrochloric acid (HCl) serving as an acid catalyst are dissolved into an $H_2O$/alcohol mixed solvent, thereby preparing a precursor solution within a mixing container. Mole ratios employed for preparing the precursor solution were determined such that 0.05 parts surface active agent, 0.1 parts silica derivative, and 2 parts acid catalyst are mixed together with the solution being taken as 100 parts. Mole ratios employed for preparing the second precursor solution are determined such that 0.5 parts surface active agent, 5 parts silica derivative, and 2 parts acid catalyst are mixed together with the solution being taken as 100 parts. As shown in FIG. 9, the thus-formed first and second precursor solutions are dropped onto the surface of the substrate 1 placed on a spinner by way of respective nozzles. The substrate is spun at 500 to 5000 rpm, to thus form a mesoporous silica thin film. The mesoporous silica thin film is maintained at 30° C. to 150° C. for one to 120 hours, whereby the silica derivative is subjected to polymerization through hydrolysis polycondensation reaction (a preliminary crosslinking process), thereby forming a mesoporous silica thin film while a cyclic self-agglomerate of the surface active agent is taken as a mold. Here, the preliminary crosslinking process is performed preferably at 60° C. to 120° C., more preferably at 70° C. to 90° C., for about 12 to 72 hours.

Subsequently, the mesoporous silica thin film is brought into contact with an alumina silica solution at 0° C. to 90° C., preferably, 20° C. to 30° C., for several seconds to five hours. As a result, through substitution, portions of the surface active agent are replaced with alumina ions, alumina molecules, an alumina polymer, or ultrafine alumina particles, thereby forming supports.

Finally, as in the case of the fourteenth embodiment, the substrate is sintered so as to completely thermally decompose and remove the surface active agent, thus forming a pure mesoporous silica thin film.

In this way, as shown in FIGS. 26A and 26B, the thin film 7 of low dielectric constant of the embodiment is formed. In fact, in order to form a bit line BL, the low dielectric thin film must be formed twice. An interlayer dielectric film of two-layer structure having different layouts of pores may be formed by use of precursor solutions of different composition ratios before and after formation of the bit line BL.

In the embodiment, the substrate is subjected to preliminary crosslinking after the precursor solution has been applied over the surface of the substrate. However, the precursor solution may be applied over the surface of the substrate after the substrate has been subjected to crosslinking. By means of such a configuration, the precursor solutions hardly become mixed together and can maintain their own states. For this reason, an interlayer dielectric film having a plurality of cyclic porous structures can be formed more easily. Moreover, productivity can be improved by means of preliminary crosslinking.

Subsequently, by means of the ordinary method, contact holes 8 are formed in the thin film 7 of low dielectric constant. After plugs have been formed by embedding a highly-doped polycrystalline silicon layer in the respective contact holes, an iridium oxide layer is formed through use of a gas mixture consisting of argon and oxygen while iridium is used as a target. A platinum layer is formed on the iridium oxide layer while platinum is used as a target. In this way, as shown in FIG. 8C, the iridium oxide layer having a thickness of about 50 nm and the platinum layer having a thickness of about 200 nm are formed. These layers are patterned through photolithography, to thereby form the lower electrodes 9.

A PZT film is formed on the lower electrodes 9 as the ferroelectric film 10 by means of a sol-gel method. A mixed solution of Pb $(CH_3COO)_2.3H_2O, Zr(t-OC_4H_9)_4, Ti(i-OC_3H_7)_4$ is used as a starting material. After the mixed solution has been applied over the substrate through spin coating, the substrate is dried at 150° C. and subjected to temporal sintering for 30 minutes at 400° C. in a dry air atmosphere. After having been repeatedly subjected to these operations five times, the substrate is subjected to heat treatment at a temperature of 700° C. or greater in an $O_2$ atmosphere. Thus, the ferroelectric film 10 having a thickness of 250 nm is formed. Here, the PZT film is formed while "x" in $PbZr_xTi_{1-x}O_3$ is taken as 0.52 [hereinafter expressed as PZT (52/48)] (FIG. 8D).

Figure 26:
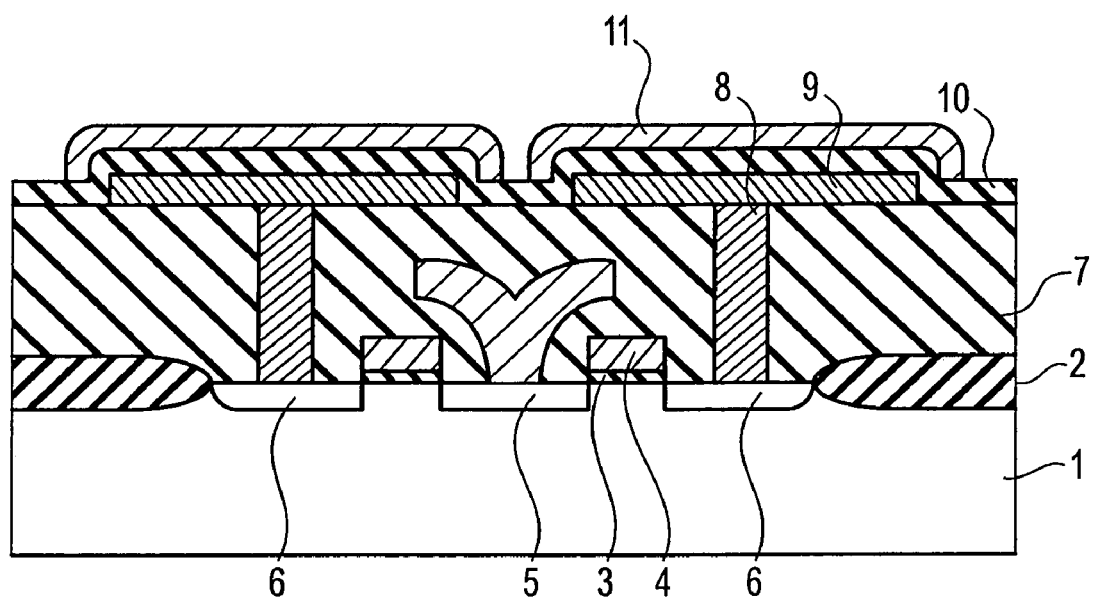
FIGS. 26(a)-26(b) are views showing FRAM using a dielectric film formed by means of a method according to a fifteenth embodiment of the invention.
Figure 26:
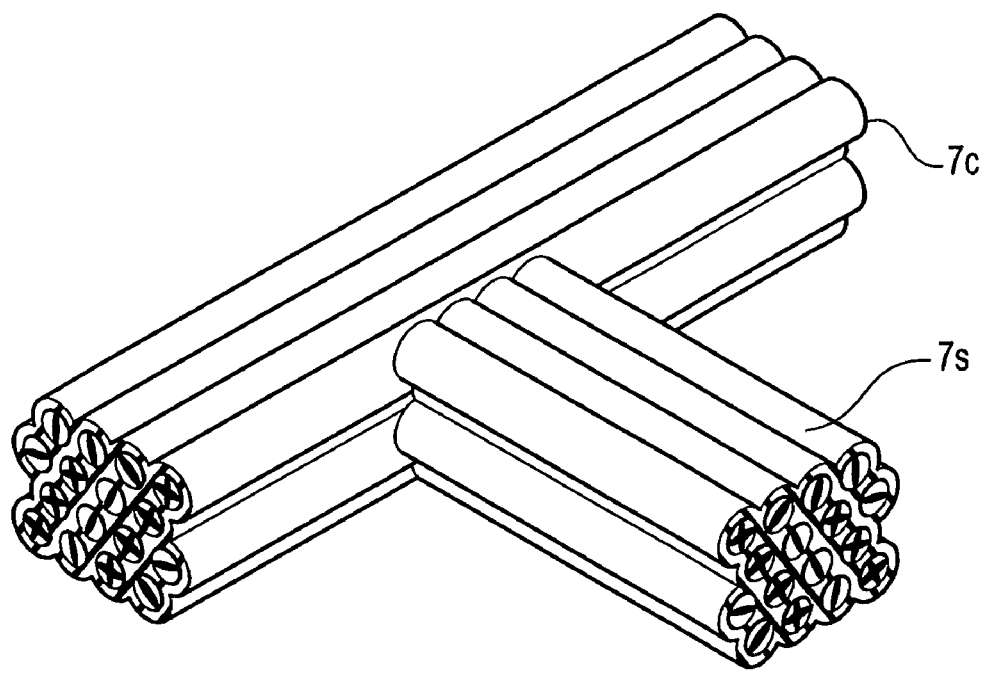

The laminated film 11 consisting of iridium oxide and iridium is formed on the ferroelectric film 10 by means of sputtering. The laminated film consisting of an iridium oxide layer and an iridium layer is taken as an upper electrode 11. The iridium layer and the iridium oxide layer are formed to a total thickness of 200 nm. Thus, a ferroelectric capacitor can be obtained, and the FRAM shown in FIG. 26 is formed.

By means of such a configuration, the interlayer dielectric film is formed from a low dielectric thin film formed from the mesoporous silica thin film. Hence, capacitance attributable to the interlayer dielectric film is diminished, and there can be formed FRAM whose switching characteristic is good and which can operate at high speed.

By employment of a cyclic porous structure, the mechanical strength of the dielectric film can be enhanced, and the dielectric film having high reliability can be obtained. The first and second porous structure domains in which columnar pores are cyclically arranged in difference directions are arranged repeatedly. Hence, the pores can assume a closed structure in which no opening sections are provided for the upper and lower wiring. The interlayer dielectric film plays the role of a low dielectric thin film which has superior moisture resistance and high reliability. Accordingly, no leakage current arises, and the interlayer dielectric film has longer life.

The compositions of the first and second precursor solutions are not limited to the compositions employed in the embodiment. Under the assumption that the solution assumes a value of 100, the surface active agent preferably assumes a value of 0.01 to 0.1; the silica derivative preferably assumes a value of 0.01 to 0.5; and the acid catalyst preferably assumes a value of 0 to 5. Use of the precursor solution having the composition enables formation of a dielectric film of low dielectric constant having columnar pores.

In the respective embodiments, the low dielectric film can be set so as to assume a pore ratio of 50% or higher.

In the embodiment, cationic cetyltrimethyl ammonium bromide [CTAB: $C_{16}H_{33}N^+(CH_3)_3Br^-$] is used as a surface active agent. It goes without saying that the surface active agent is not limited to such an agent, and another surface active agent may be employed.

Use of alkali ions, such as Na ions, as catalysts will deteriorate a semiconductor material. Therefore, use of a cationic surface active agent and use of an acid catalyst are preferable. In addition to HCl, nitric acid ($HNO_3$), sulfuric acid ($H_2SO_4$), phosphoric acid ($H_3PO_4$), $H_4SO_4$, or the like may also be used as the acid catalyst.

The silica derivative is not limited to TMOS. Silicon alkoxide material, such as tetraethoxy silane (TEOS), is preferably used.

Further, the water $H_2O$/alcohol mixed solvent is used as a solvent. However, it may be the case that only water is used.

Moreover, although the nitrogen atmosphere is used as a sintering atmosphere, sintering is performed in preferably the atmosphere of oxygen or may be performed in the atmosphere, under a reduced pressure, or in a nitrogen atmosphere. Preferably, additional sintering involving usage of a foaming gas formed from a gas mixture consisting of nitrogen and hydrogen enhances moisture resistance, thereby enabling an attempt to reduce a leakage current.

A mixing ratio of the surface active agent, the silica derivative, the acid catalyst, and the solvent can be changed as required.

The preliminary polymerization process is conducted at 30° C. to 150° C. for one through 120 hours. The temperature is desirable set to 60° C. to 120° C., more preferably to 90° C.

The sintering process is performed for one hour at 400° C. However, sintering may be performed at 300° C. to 500° C. from one to five hours or thereabouts. Preferably, the temperature is set to 350° C. to 450° C.

At the time of formation of the poles, silanol molecules may be used in lieu of alumina. In this case, after the silica solution has been heated and subjected to preliminary crosslinking, a solution containing silanol molecules may be brought into contact with the silica solution, to thereby replace alumina with silanol molecules through substitution.

Figure 12:
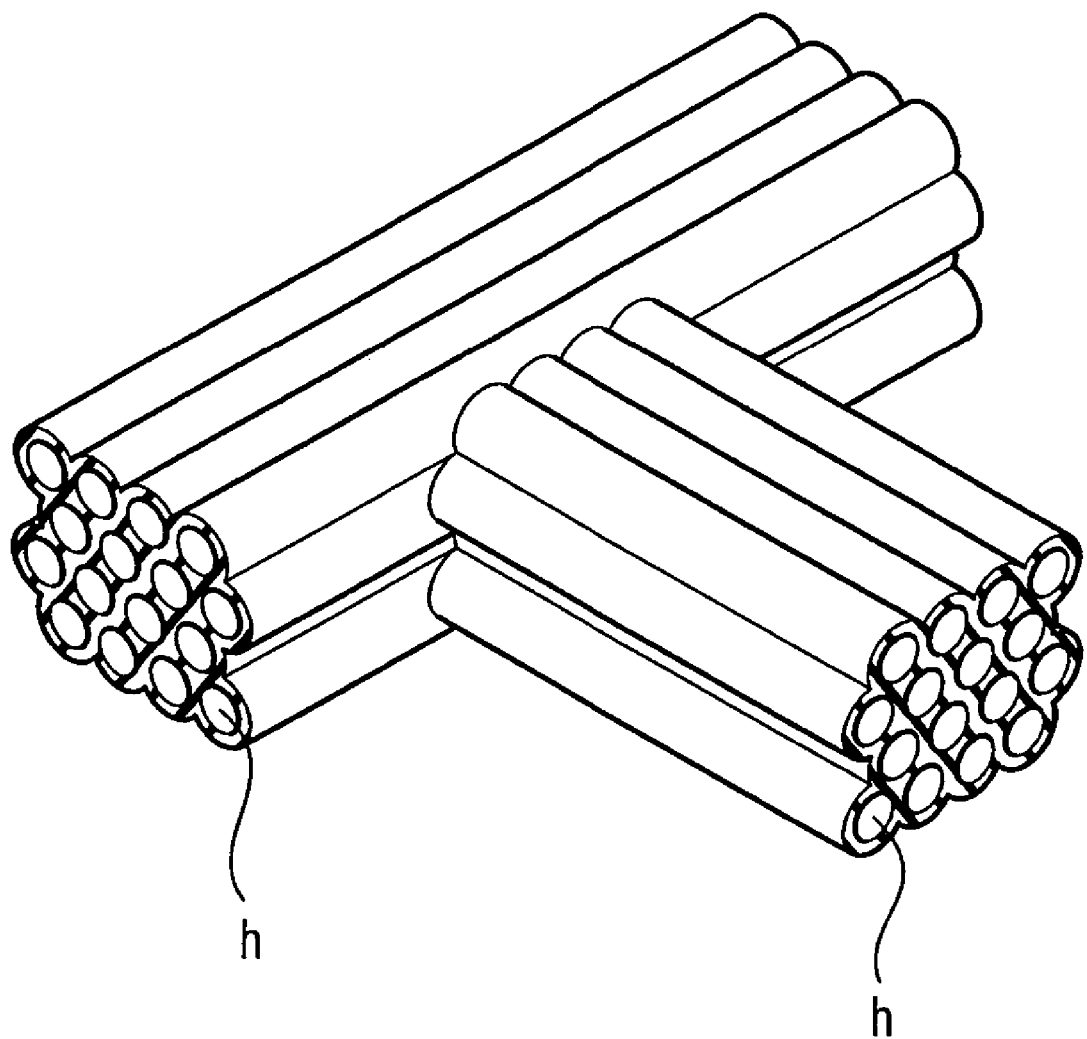
FIG. 12 is a descriptive view showing a dielectric film according to a sixth embodiment of the invention.

As shown in FIG. 12, a structure—including a regular arrangement of a porous structure domain having the poles S provided in the layered pores formed in parallel with the surface of the substrate and a porous structure domain having the poles S provided in the layered pores formed at right angles to the surface of the substrate—is also effective as a modification of the dielectric film of low dielectric constant.

Figure 27:
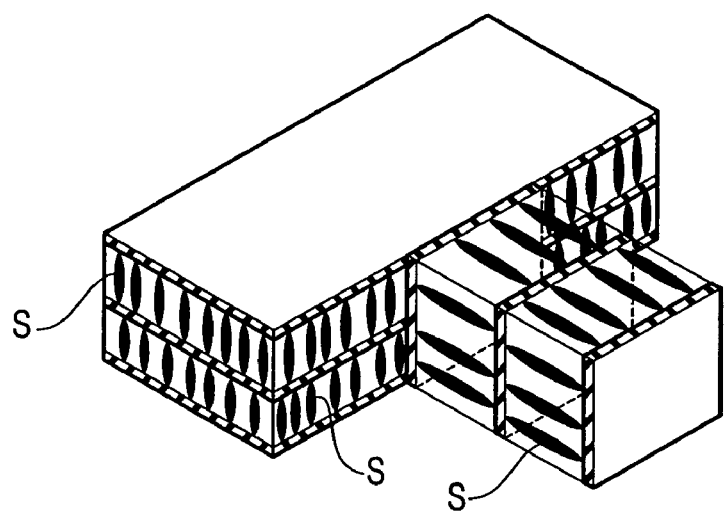
FIG. 27 is a structural descriptive view showing a modification of a dielectric film of low dielectric constant according to the invention.

As shown in FIG. 27, a structure—including a regular arrangement of the porous structure domain having the poles S provided in the layered pores formed in parallel with the surface of the substrate and a porous structure domain having one or two poles provided in periodically-arranged columnar pores—is also effective as a modification of the dielectric film of low dielectric constant.

Figure 14:
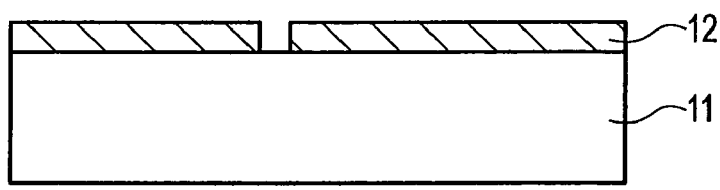
FIGS. 14(a)-14(d) are views showing processes for manufacturing the semiconductor device of multilayer wiring structure shown in FIG. 13.
Figure 14:
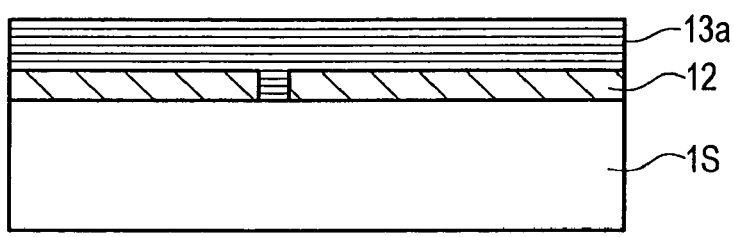
Figure 14:
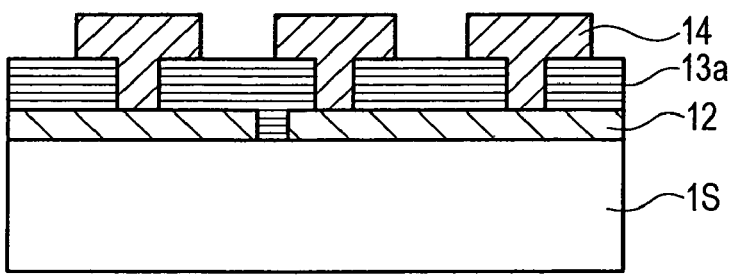
Figure 14:
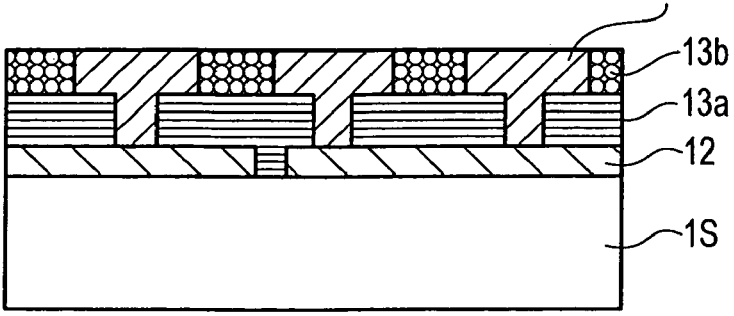
Figure 28:
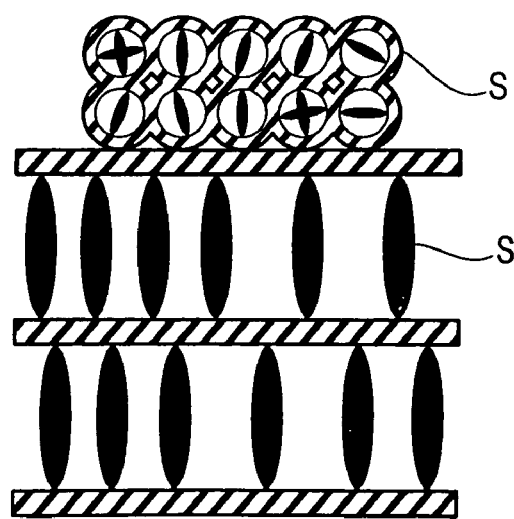
FIG. 28 is a structural descriptive view showing a modification of the dielectric film of low dielectric constant according to the invention.
Figure 29:
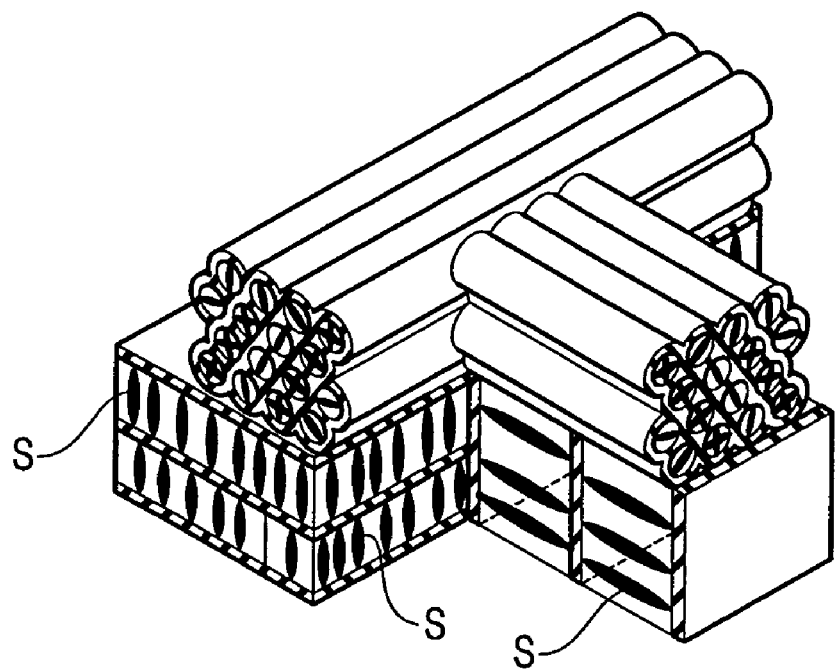
FIG. 29 is a structural descriptive view showing a modification of the dielectric film of low dielectric constant according to the invention.
Figure 30:
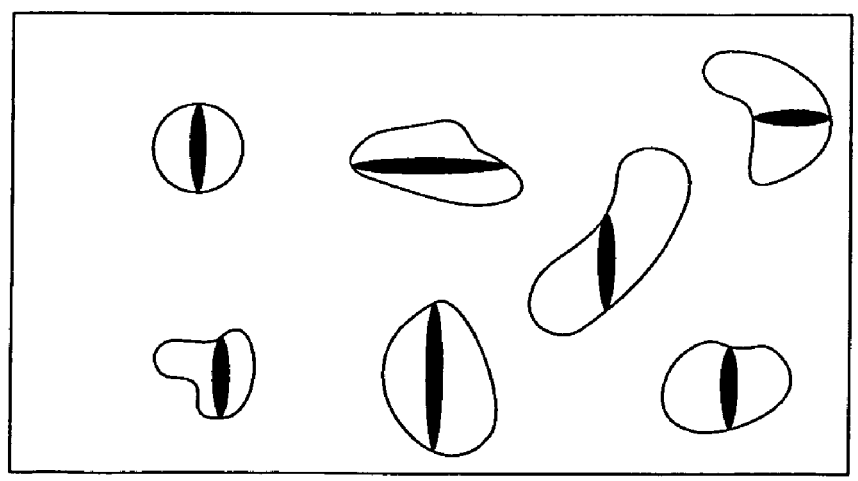
FIG. 30 is a structural descriptive view showing a modification of the dielectric film of low dielectric constant according to the invention.

As shown in FIG. 14, a structure—in which there coexist, in different directions within a plane, a porous structure domain having the poles S provided in the layered pores formed in parallel with the surface of the substrate and a porous structure domain having the poles provided in periodically-arranged columnar pores; that is, a structure shown in FIG. 28—is also effective as a modification of the dielectric film of low dielectric constant.

As shown in FIG. 15, a so-called amorphous porous structure—in which the pores having the poles S are arranged at random—is also effective as a modification of the dielectric film of low dielectric constant.

In addition, the embodiments have described the interlayer dielectric film of FRAM. However, the invention can also be applied to silicon devices such as bipolar devices, BiCMOSs, or CMOSs; other high-speed devices such as HEMTs; high-frequency devices such as microwave ICs; and highly-integrated ferroelectric memory of MFMIS type.

INDUSTRIAL APPLICABILITY

As has been described, the invention can provide a dielectric film having enhanced mechanical strength and a low dielectric constant.

An effective low dielectric thin film can be obtained as, particularly, an interlayer dielectric film.

The invention claimed is:

1. A semiconductor device comprising:
an inorganic film which is formed on the surface of a substrate and has cyclic porous structures of two or more types,
wherein the inorganic film comprises an interlayer dielectric film that comprises a first interlayer dielectric film which is formed on a first layer wiring conductor and has contact holes to contact the first layer wiring conductor, and a second interlayer dielectric film to be charged into an inter-wiring area of a second layer wiring conductor formed on the first interlayer dielectric film; and the first interlayer dielectric film is formed from a second porous structure domain in which layered pores are arranged cyclically.

2. The semiconductor device according to claim 1, wherein the inorganic film is a dielectric film formed by repeatedly laminating, on and in parallel with the surface of the substrate, a first porous structure domain layer in which columnar pores are arranged cyclically, and a second porous structure domain in which layered pores are cyclically arranged in parallel with the surface of the substrate.

3. The semiconductor device according to claim 1, wherein the inorganic film is a dielectric film formed on the surface of the substrate and has a cyclic porous structure including columnar pores oriented so as to become parallel with the surface of the substrate.

4. The semiconductor device according to claim 1, wherein the inorganic film is a dielectric film formed on the surface of the substrate and includes a plurality of cyclic porous structure domains containing columnar pores oriented in one direction so as to become parallel with the surface of the substrate; and adjacent porous structure domains are oriented in different directions.

5. The semiconductor device according to claim 1, wherein the inorganic film is a dielectric film formed on the surface of the substrate and has a cyclic porous structure domain in which layered pores are oriented cyclically in one direction so as to become parallel with the surface of the substrate.

6. A semiconductor device comprising:
an inorganic film which is formed on the surface of a substrate and has cyclic porous structures of two or more types,
wherein the inorganic film comprises an interlayer dielectric film that comprises a first interlayer dielectric film which is formed on a the first layer wiring conductor and has contact holes to contact the first layer wiring conductor, and a second interlayer dielectric film to be charged into an inter-wiring area of a second layer wiring conductor formed on the first interlayer dielectric film; the first interlayer dielectric film is formed from a second porous structure domain in which layered pores are arranged cyclically; and the second interlayer dielectric film is formed from a first porous structure domain in which columnar pores are arranged cyclically.

7. The semiconductor device according to claim 6, wherein the inorganic film is a dielectric film formed by repeatedly laminating, on and in parallel with the surface of the substrate, a first porous structure domain layer in which columnar pores are arranged cyclically, and a second porous structure domain in which layered pores are cyclically arranged in parallel with the surface of the substrate.

8. The semiconductor device according to claim 6, wherein the inorganic film is a dielectric film formed on the surface of the substrate and has a cyclic porous structure including columnar pores oriented so as to become parallel with the surface of the substrate.

9. The semiconductor device according to claim 6, wherein the inorganic film is a dielectric film formed on the surface of the substrate and includes a plurality of cyclic porous structure domains containing columnar pores oriented in one direction so as to become parallel with the surface of the substrate; and adjacent porous structure domains are oriented in different directions.

10. The semiconductor device according to claim 6, wherein the inorganic film is a dielectric film formed on the surface of the substrate and has a cyclic porous structure domain in which layered pores are oriented cyclically in one direction so as to become parallel with the surface of the substrate.

11. A semiconductor device comprising:
an inorganic film which is formed on the surface of a substrate and has cyclic porous structures of two or more types,
wherein the inorganic film comprises an interlayer dielectric film that comprises a first interlayer dielectric film which is formed on a first layer wiring conductor and has contact holes to contact the first layer wiring conductor, and a second interlayer dielectric film to be charged into an inter-wiring area of a second layer wiring conductor formed on the first interlayer dielectric film; the first interlayer dielectric film is formed from a second porous structure domain in which layered pores formed so as to become parallel with the surface of the substrate are arranged cyclically; and the second interlayer dielectric film is formed from a third porous structure domain in which layered pores formed so as to become substantially perpendicular to the surface of the substrate are arranged cyclically.

12. The semiconductor device according to claim 11, wherein the inorganic film is a dielectric film formed by repeatedly laminating, on and in parallel with the surface of the substrate, a first porous structure domain layer in which columnar pores are arranged cyclically, and a second porous structure domain in which layered pores are cyclically arranged in parallel with the surface of the substrate.

13. The semiconductor device according to claim 11, wherein the inorganic film is a dielectric film formed on the surface of the substrate and has a cyclic porous structure including columnar pores oriented so as to become parallel with the surface of the substrate.

14. The semiconductor device according to claim 11, wherein the inorganic film is a dielectric film formed on the surface of the substrate and includes a plurality of cyclic porous structure domains containing columnar pores oriented in one direction so as to become parallel with the surface of the substrate; and adjacent porous structure domains are oriented in different directions.

15. The semiconductor device according to claim 11, wherein the inorganic film is a dielectric film formed on the surface of the substrate and has a cyclic porous structure domain in which layered pores are oriented cyclically in one direction so as to become parallel with the surface of the substrate.

* * * * *